United States Patent
Fujioka et al.

(10) Patent No.: US 12,286,541 B2
(45) Date of Patent: Apr. 29, 2025

(54) SURFACE-TREATED SOL-GEL SILICA AND METHOD FOR PRODUCING SAME

(71) Applicant: TOKUYAMA CORPORATION, Shunan (JP)

(72) Inventors: Hiromasa Fujioka, Shunan (JP); Osamu Tanaka, Shunan (JP); Hiroaki Taira, Shunan (JP); Naoki Mikami, Shunan (JP); Toshiaki Ootani, Shunan (JP)

(73) Assignee: TOKUYAMA CORPORATION, Shunan (JP)

( * ) Notice: Subject to any disclaimer, the term of this patent is extended or adjusted under 35 U.S.C. 154(b) by 1345 days.

(21) Appl. No.: 16/643,542

(22) PCT Filed: Aug. 29, 2018

(86) PCT No.: PCT/JP2018/032023
§ 371 (c)(1),
(2) Date: Feb. 29, 2020

(87) PCT Pub. No.: WO2019/044929
PCT Pub. Date: Mar. 7, 2019

(65) Prior Publication Data
US 2020/0199371 A1 Jun. 25, 2020

(30) Foreign Application Priority Data
Aug. 31, 2017 (JP) ................. 2017-166422

(51) Int. Cl.
*C01B 33/14* (2006.01)
*C01B 33/141* (2006.01)
*C09C 3/08* (2006.01)
*C09C 3/10* (2006.01)
*H01L 23/29* (2006.01)

(52) U.S. Cl.
CPC .............. *C09C 3/10* (2013.01); *C01B 33/141* (2013.01); *C09C 3/08* (2013.01); *H01L 23/29* (2013.01); *C01P 2004/51* (2013.01); *C01P 2004/61* (2013.01); *C01P 2006/16* (2013.01)

(58) Field of Classification Search
CPC .............. C01P 2006/16; C01P 2004/51; C01P 2004/61; C01P 2004/32; C09C 3/10; C09C 3/08; H01L 23/29; C01B 33/141; C01B 33/14; C01B 33/18
See application file for complete search history.

(56) References Cited

U.S. PATENT DOCUMENTS

| | | |
|---|---|---|
| 2003/0133890 A1 | 7/2003 | Kato et al. |
| 2009/0042121 A1 | 2/2009 | Toizumi et al. |
| 2012/0237673 A1 | 9/2012 | Kuniyasu et al. |
| 2012/0323030 A1 | 12/2012 | Ishizu et al. |
| 2015/0056119 A1 | 2/2015 | Ishizu et al. |
| 2016/0159654 A1 | 6/2016 | Muraguchi et al. |

FOREIGN PATENT DOCUMENTS

| | | |
|---|---|---|
| CN | 102762498 A | 10/2012 |
| CN | 105408252 A | 3/2016 |
| EP | 1323673 A2 | 7/2003 |
| EP | 2537804 A1 | 12/2012 |
| JP | 2003-252616 A | 9/2003 |
| JP | 2007230789 A | 9/2007 |
| JP | 2009042571 A | 2/2009 |
| JP | 2012-006823 A | 1/2012 |
| JP | 2012-171813 A | 9/2012 |
| JP | 2012187563 A | 10/2012 |
| JP | 2013-193950 A | 9/2013 |
| JP | 2016-190770 A | 11/2016 |
| JP | 2018-096876 A1 | 10/2019 |
| TW | 200301221 A | 7/2003 |
| TW | 201144226 A | 12/2011 |
| WO | 2015/016359 A1 | 2/2015 |
| WO | 2018/096876 A1 | 5/2018 |

OTHER PUBLICATIONS

JP2013249215, Yusuke et al., published Dec. 12, 2013, machine translation.*
Database WPI-1, Clarivaet Analytics, 2017.

* cited by examiner

*Primary Examiner* — Smita S Patel
(74) *Attorney, Agent, or Firm* — Maschoff Brennan

(57) ABSTRACT

This surface-treated sol-gel silica is characterized by containing sol-gel silica having an average particle size of 0.05 μm or more and 2.0 μm or less as measured by laser diffraction scattering and a surface treatment agent on the surface of the sol-gel silica. In a dispersion produced by dispersing 5 mass % of the sol-gel silica in ethanol by emitting ultrasonic waves at 40W for 10 minutes, the content of particles with particle sizes of 5 μm or more is 10 ppm or less in a particle number size distribution obtained by a Coulter counter method.

7 Claims, No Drawings

SURFACE-TREATED SOL-GEL SILICA AND METHOD FOR PRODUCING SAME

TECHNICAL FIELD

The present invention relates to surface-treated sol-gel silica that can be suitably used as a filler for semiconductor encapsulants, sealants for liquid crystal, films, etc. More particularly, the present invention relates to surface-treated sol-gel silica having a very small coarse particle count.

BACKGROUND ART

Silica is added as a filler to various resin compositions for electronic materials such as semiconductor encapsulants and sealants for liquid crystal and for film production.

As semiconductor devices are rapidly reduced in size and thickness and the packaging density is rapidly becoming higher, the gap between a substrate and elements is increasingly becoming narrower. Higher thermal conductivity, lower thermal expansion, and higher moldability are therefore required, and silica is required to have high filling ability. At the same time, resin compositions filled with silica are also required to have low viscosity. Accordingly, there is a growing demand for highly monodisperse surface-treated silica containing no coarse particles.

Sol-gel silica that is produced by what is called a sol-gel process is conventionally known as highly monodisperse silica. In the sol-gel process, silicon alkoxide such as tetraethoxysilane is fed as a raw material into a reaction solution containing a hydrolysis catalyst, water, and an organic solvent, thereby causing hydrolysis and polycondensation of silicon alkoxide. It is known that, in this process, the particle size and the particle size distribution can be controlled to some extent by controlling the reaction conditions for the reaction of this process.

Patent Document 1 describes a method for producing highly monodisperse silica. In this method, the reaction conditions of the sol-gel process are adjusted to control the grain size and the grain size distribution and restrain formation of coarse particles such as particles adhering to each other and agglomerates.

In a sol-gel silica dispersion produced by the sol-gel process, sol-gel silica particles are highly dispersed as fine primary particles, and substantially no agglomerate is seen in the distribution. However, in the case where the sol-gel silica particles are taken out as dry powder, processes such as separating sol-gel silica from the dispersion by solid-liquid separation, drying, and when necessary, baking are required. In these later processes, the silica particles are strongly agglomerated. Once the silica particles are strongly agglomerated, it is difficult to crush such agglomerates into primary particles. The resultant silica thus contains an increased amount of coarse particles.

In the case where such silica containing coarse particles is added to a resin composition, the coarse particles of the silica contained in the resin composition hinder smooth resin flow and reduce fluidity when the resin composition is melted. As a result, fish eyes or projections are formed when producing a molding such as a film. In the case where such a resin composition with low fluidity is used for semiconductor encapsulants or sealants for liquid crystal, the resin composition causes what is called "flow marks," which are flow lines of a melted resin. Moreover, the resin composition does not have sufficient gap penetrability for narrower gaps between the substrate and the elements and therefore tends to clog between wirings.

Patent Document 2 discloses a method for producing sol-gel silica in which a coagulating agent comprised of a specific compound is added to a sol-gel silica dispersion obtained by a sol-gel process, the resultant dispersion is concentrated, and the concentrate is dried. According to this method, silica particles are not strongly agglomerated but are loosely aggregated in a later process. Patent Document 2 describes that such loose aggregates can be easily crushed into primary particles by shearing etc. of a dispersing machine for dispersing the silica particles in resin. According to this method, by performing the sol-gel process so as to produce highly monodisperse silica as described above, aggregates formed in a later process can be crushed back into primary particles. Silica contains substantially no coarse particles is thus produced. Namely, it is possible to produce silica having no detectable coarse particles with a particle size larger than 5 μm as measured by a widely used particle size distribution measurement method, specifically laser diffraction scattering.

After the process of producing silica having a reduced amount of coarse particles, the silica is dried, and a surface treatment agent such as a silane coupling agent is added to the dried silica to treat the particle surfaces. Such surface treatment of the silica improves dispersibility of the silica in resin, increases the strength of the resin composition, and provides various functions (paragraphs 0079 and 0122 to 0125 of Patent Document 2). Surface-treated silica is typically obtained by stirring and mixing silica and a surface treatment agent using a mixer having a stirring blade and performing heat treatment.

For example, the surface-treated silica is suitably used as a filter in order to reduce the coefficient of thermal expansion of semiconductor encapsulants and increase the strength thereof. As is known in the art, if aggregated particles or particles having unevenly treated surfaces are present in the powder, such particles cause reduction in dispersibility in resin or reduction in strength of resin.

With recent reduction in size of semiconductor packages, there is an ever-growing demand for silica containing a reduced amount of coarse particles and aggregates and having uniformly treated particle surfaces.

According to the conventional surface treatment method, when silica and a surface treatment agent are mixed to perform surface treatment, a considerable amount of strong agglomerates is formed during the surface treatment even in silica formed by the sol-gel process so as to have a reduced amount of coarse particles. Accordingly, there is a limit to how much formation of aggregated particles can be restrained. A significant amount of agglomerates is formed especially in the case where the surface treatment is dry surface treatment. In the case where an excessive amount of surface treatment agent is added to the surfaces of the silica particles, a more significant amount of strong agglomerates is formed due to crosslinking of the surface treatment agent.

CITATION LIST

Patent Documents

PATENT DOCUMENT 1: Japanese Unexamined Patent Publication No. 2013-193950
PATENT DOCUMENT 2: Japanese Unexamined Patent Publication No. 2012-6823

SUMMARY OF THE INVENTION

Technical Problem

There is surface-treated silica determined to contain substantially no agglomerates as coarse particles as measured by laser diffraction scattering that is widely used for particle size measurement of silica. Even with such surface-treated silica, the fluidity as a filler for resin could not actually be improved to a fully satisfactory level. As described above, with recent reduction in size and thickness of semiconductor devices and increase in packaging density, gap penetrability that is not sufficient for narrower gaps between the substrate and elements and clogging between wirings of a narrower wiring pitch are becoming increasingly serious especially in filler applications for resin compositions for electronic materials such as semiconductor encapsulants and sealants for liquid crystal. Further improvement in silica is therefore desired.

It has therefore been a great challenge to develop surface-treated silica that has high fluidity and reduces neither productivity nor yield of an intended product even when added to a resin material composition for electronic materials.

Solution to the Problem

The inventors intensively studied to solve the above problems. The inventors performed a sol-gel process to synthesize silica so that the silica became highly monodisperse as described above, and added a specific coagulating agent to the obtained sol-gel silica dispersion. The inventors thus obtained sol-gel silica in which the amount of coarse particles, namely agglomerates, was reduced to such a degree that they were not detectable by particle size distribution measurement using laser diffraction scattering. The inventors found that surface-treated sol-gel silica obtained by surface-treating this sol-gel silica had a significant amount of coarse particles when measured by a Coulter counter method having higher detection sensitivity than laser diffraction scattering. The inventors also found that these coarse particles were a factor that inhibits silica from having high fluidity required for the filler for the resin composition for electronic materials.

The inventors studied further and found that such coarse particles are not agglomerates that will be produced in a later process such as dried silica particles obtained by removing a solvent from silica slurry formed by the sol-gel process (raw silica particles) but mainly coarse independent particles that are inevitably produced during synthesis of the silica particles by the sol-gel process, and that the coarse independent particles can be efficiently removed by wet-filtering an obtained dispersion of the silica particles after synthesis of untreated silica (hereinafter referred to as sol-gel silica) by the sol-gel process. The inventors also found that strong agglomerates formed during surface treatment of the obtained silica particles can also be efficiently removed by wet filtration of the dispersion of the surface-treated sol-gel silica. The above problem can thus be solved by removing the strong agglomerates that are difficult to crush into primary particles. The inventors thus propose novel surface-treated sol-gel silica that solves the above problem.

That is, the invention is surface-treated sol-gel silica, characterized in that sol-gel silica particles have their surfaces modified by a surface treatment agent, the sol-gel silica particles have an average particle size of 0.05 μm or more and 2.0 μm or less as measured by laser diffraction scattering, and in a dispersion produced by dispersing 5 mass % of the sol-gel silica particles in ethanol by emitting ultrasonic waves at 40 W for 10 minutes, the content of particles with particle sizes of 5 μm or more is 10 ppm or less in a particle number size distribution obtained by a Coulter counter method.

Advantages of the Invention

In the surface-treated sol-gel silica of the invention, the sol-gel silica particles have an average particle size of 0.05 to 2 μm as measured by laser diffraction scattering, and the content of particles with particle sizes of 5 μm or more is 10 ppm or less in a particle number size distribution obtained by a Coulter counter method having higher detection sensitivity for coarse grains than the laser diffraction scattering as a particle size distribution measurement method. The surface-treated sol-gel silica of the invention thus contains substantially no particles with particle sizes of 5 μm or more, Accordingly, a resin component having this surface-treated sol-gel silica added thereto has very high fluidity when melted. Formation of fish eyes and projections is therefore reduced in production of moldings such as films.

In the case where the surface-treated sol-gel silica of the invention is used to fill a resin composition for electronic materials such as semiconductor encapsulants and sealants for liquid crystal, the resin composition has high gap penetrability to penetrate the narrow gaps between a substrate and elements and between a chip and wirings. Therefore, the resin composition is capable of reducing the clogging between them. This results in improved productivity and yield of electronic material members, and the surface-treated sol-gel silica of the invention is therefore very useful.

BEST MODES FOR CARRYING OUT THE INVENTION

Sol-gel silica particles of an embodiment are silica particles produced by a sol-gel process. That is, silicon alkoxide as a raw material is subjected to hydrolysis and polycondensation in a reaction medium, and silica sol thus produced is gelled. Thereafter, the solid produced is taken out and dried to produce silica particles. Sol-gel silica particles that are produced by the sol-gel process are typically independent spherical particles with sphericity of 0.9 or more.

Surface-treated sol-gel silica of the embodiment have its sol-gel silica particle surfaces modified by a surface treatment agent. The expression "sol-gel silica particle surfaces modified by a surface treatment agent" refers to the sol-gel silica particle surfaces having their surface shape, chemical composition, chemical reactivity, compatibility with resin, etc. changed as a result of treatment with the surface treatment agent. Suitably, modifying sol-gel silica particle surfaces by a surface treatment agent corresponds to introducing carbon atoms into a sol-gel silica surface to improve compatibility with resin and provide water repellency. Improving compatibility with resin improves dispersibility of sol-gel silica in resin, reduces viscosity of a resin composition, and increases strength of the resin composition. The water repellency is provided to sol-gel silica, the surface-treated sol-gel silica adsorbs less moisture during storage and thus has improved storage stability etc.

The degree to which the sol-gel silica surface is modified by introducing carbon atoms therein can be evaluated by the carbon content in the sol-gel silica surface. The surface carbon content is measured using a carbon analyzer by a combustion oxidation process. Specifically, a surface-treated sol-gel silica sample is heated to 1350° C. in an oxygen atmosphere, and the resultant carbon content of the sample is converted to the carbon content per gram of the sample.

Surface-treated sol-gel silica to be used for measurement is heated to 80° C. as a pretreatment, and the system is decompressed to remove moisture etc. adsorbed in air from the surface-treated sol-gel silica. The carbon content of the surface-treated sol-gel silica is then measured. The surface carbon content of the surface-treated sol-gel silica can be obtained by subtracting the carbon content of non-surface-treated sol-gel silica measured in a similar manner from the measured carbon content of the surface-treated sol-gel silica.

The surface carbon content of the surface-treated sol-gel silica is preferably 0.01 mass % or more and 1 mass % or less, and more preferably 0.03 mass % or more and 0.8 mass % or less.

Specific forms of the surface-treated sol-gel silica of the present invention may include sol-gel silica particle surfaces treated with at least one selected from the group consisting of silane coupling agents and silazanes, sol-gel silica particle surfaces coated with resin, and sol-gel silica particle surfaces treated with at least one selected from the group consisting of silane coupling agents and silazanes and coated with resin.

The surface treatment agent is not particularly limited as long as it is a known surface treatment agent that is used to provide a specific function to the silica surface. It is preferable that the surface treatment agent be at least one selected from silicone oil, silane coupling agents, siloxanes, and silazanes. It is particularly preferable that the surface treatment agent be at least one selected from the group consisting of silane coupling agents and silazanes. In the form in which the sol-gel silica particle surfaces is coated with resin, resin can also be used as the surface treatment agent.

It is desirable to select a surface treatment agent having a functional group according to modified properties to be provided to the resultant surface-treated sol-gel silica. A surface treatment agent having a polymerizable group such as an epoxy group or a (meth)acrylic group is preferable for applications of fillers for electronic materials such as semiconductor encapsulants and sealants for liquid crystal and for film production. That is, in these applications, an epoxy resin and a (meth)acrylic resin are universally used as resins that are added to surface-treated sol-gel silica. It is therefore preferable to use a surface treatment agent having a polymerizable group such as an epoxy group or a (meth)acrylic group according to the polymerizable groups of these resins. In this case, the surface-treated sol-gel silica can be firmly bonded to the added resins when these resins are cured, and thus the surface-treated sol-gel silica has higher strength.

In the case where the polymerizable group is introduced into the sol-gel silica surface using such a surface treatment agent, the polymerizable group is preferably introduced into the sol-gel silica surface at 5 to 25 µmol/m², and more preferably 3 to 15 µmol/m², per specific surface area of the sol-gel silica surface.

Specific examples of the surface treatment agent that is used in the present embodiment will be provided below. Specific examples of the silicone oil include dimethyl silicone oil, methyl phenyl silicone oil, methyl hydrogen silicone oil, alkyl-modified silicone oil, amino-modified silicone oil, epoxy-modified silicone oil, carboxyl-modified silicone oil, carbinol-modified silicone oil, methacryl-modified silicone oil, polyether-modified silicone oil, and fluorine-modified silicone oil.

Specific examples of the silane coupling agent include methyltrimethoxysilane, methyltriethoxysilane, hexyltrimethoxysilane, decyltrimethoxysilane, phenyltriethoxysilane, vinyltrimethoxysilane, vinyltriethoxysilane, 3-methacryloyloxypropyltrimethoxysilane, 3-methacryloyloxypropyltriethoxysilane, 3-acryloyloxytrimethoxysilane, 3-glycidoxypropyltrimethoxysilane, 3-glycidoxypropyltriethoxysilane, 3-aminopropyltrimethoxysilane, 3-aminopropyltriethoxysilane, N-(2-aminoethyl)-3-aminopropyltrimethoxysilane, N-(2-aminoethyl)-3-aminopropylmethyldimethoxysilane, N-phenyl-3-aminopropyltrimethoxysilane, N,N-dimethyl-3-aminopropyltrimethoxysilane, N,N-diethyl-3-aminopropyltrimethoxysilane, and 4-styryltrimethoxysilane.

Specific examples of the siloxanes include disiloxane, hexamethyldisiloxane, hexamethylcyclotrisiloxane, octamethylcyclotetrasiloxane, decamethylcyclopentasiloxane, and polysiloxanes such as polydimethylsiloxane.

As the silazanes, commonly used known compounds having a silicon-nitrogen (Si—N) bond can be used without any particular limitation. A compound to be used is selected as appropriate form these compounds according to required performance etc. of the surface-treated sol-gel silica particles. Specific examples of the silazanes include hexamethyldisilazane, 1,3-divinyl-1,1,3,3-tetramethyldisilazane, octamethyltrisilazane, hexa(t-butyl)disilazane, hexabutyldisilazane, hexaoctyldisilazane, 1,3-diethyltetramethyldisilazane, 1,3-di-n-octyltetramethyldisilazane, 1,3-diphenyltetramethyldisilazane, 1,3-dimethyltetraphenyldisilazane, 1,3-diethyltetramethyldisilazane, 1,1,3,3-tetraphenyl-1,3-dimethyldisilazane, 1,3-dipropyltetramethyldisilazane, hexamethylcyclotrisilazane, hexaphenyldisilazane, dimethylaminotrimethylsilazane, trisilazane, cyclotrisilazane, and 1,1,3,3,5,5-hexamethylcyclotrisilazane.

Among these, alkyldisilazanes are preferable due to their high reactivity with a silica surface. Specifically, the alkyldisilazanes are compounds given by the following general formula

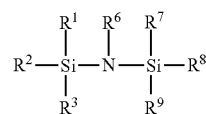

[Formula 1]

(where each of $R^1$ to $R^3$ represents a hydrogen atom, an alkyl group that has 10 or less (preferably 1 to 3) carbons and that may have a halogen atom, or an aryl group, at least one of $R^1$ to $R^3$ represents an alkyl group that has 10 or less carbons and that may have a halogen atom, $R^6$ represents a hydrogen atom or a methyl group, and $R^7$ to $R^9$ are the same as $R^1$ to $R^3$). Particularly preferably, the alkyldisilazanes are tetramethyldisilazane, hexamethyldisilazane, and heptamethyldisilazane.

In the case where the surface treatment is in the form of coating a silica surface, a resin for coating (hereinafter sometimes referred to as the coating resin) is not particularly limited. The resin may be directly used to coat a sol-gel silica surface. Preferably, the resin is a polymerizable composition containing a polymerizable monomer which coats a sol-gel silica surface and is then polymerized on the sol-gel silica surface. For high strength, the resin is preferably a crosslinked polymer. It is suitable that the crosslinked polymer be a covalently crosslinked polymer from the safety point of view.

It is desirable to select a coating resin having a functional group according to modified properties to be provided to the resultant surface-treated sol-gel silica. For applications of fillers for electronic materials such as semiconductor encapsulants and sealants for liquid crystal and for film production, a coating resin having a polymerizable group such as an epoxy group or a (meth)acrylic group is preferable for the same reason as above.

In the case where a polymer having an epoxy group is used as a coating resin, this polymer is a polymer of a polymerizable composition containing a radical polymerizable monomer having an epoxy group (hereinafter sometimes referred to as the "epoxy group-containing radical polymerizable monomer"). When a polymer contains such a monomer, it means that the polymer itself has an epoxy group. The radial polymerizable group is preferably a (meth) acryl group, a vinyl group, etc.

It is preferable that the radical polymerizable monomer be a (meth)acryl radial polymerizable monomer as it is easy to produce surface-treated sol-gel silica using the (meth)acryl radial polymerizable monomer. Specific examples of the (meth)acryl radial polymerizable monomer include glycidyl (meth)acrylate and (meth)acrylic glycidyl ether. These epoxy group-containing radical polymerizable monomers may be used alone or in combination of two or more, depending on the intended coating resin.

It is preferable that the polymerizable composition containing an epoxy group-containing radical polymerizable monomer contain a crosslinking agent as its polymer is crosslinked. As the crosslinking agent, any compound having two or more radical polymerizable groups in a molecule can be used without any particular limitation. Examples of the crosslinking agent include aromatic vinyl monomers of polyfunctional aromatic vinyl compounds such as divinylbenzene, divinylbiphenyl, trivinylbenzene, and divinylnaphthalene, polyfunctional (meth)acrylic monomers such as ethylene glycol di(meth)acrylate, diethylene glycol di(meth) acrylate, triethylene glycol di(meth)acrylate, propylene glycol di(meth)acrylate, 1,6-hexanediol di(meth)acrylate, trimethylolmethane tri(meth)acrylate, tetramethylolmethane tetra(meth)acrylate, methylenebis(meth)acrylamide, and hexamethylene di(meth)acrylamide, and (meth)allyl (meth) acrylates.

In the case where a polymer having a (meth)acrylic group is used as a coating resin, this polymer is usually a polymer of a polymerizable composition containing a non-radical polymerizable monomer having a (meth)acrylic group. Such a non-radical polymerizable monomer having a (meth) acrylic group is preferably a polymerizable monomer having a (meth)acrylic group and also having an epoxy group as a non-radial polymerizable group (hereinafter sometimes referred to as the "(meth)acrylic group/epoxy group-containing monomer). When a polymer contains such a monomer, it means that the polymer itself has a (meth)acrylic group. The epoxy group may be polymerized by cationic ring-opening polymerization or may be polymerized by a polyaddition reaction in the presence of an epoxy curing agent.

Specific examples of the (meth)acrylic group/epoxy group-containing monomer include glycidyl acrylate, glycidyl methacrylate, β-methylglycidyl acrylate, β-methylglycidyl methacrylate, bisphenol A-monoglycidylether-methacrylate, 4-glycidyloxybuthyl methacrylate, 3-(glycidyl-2-oxyethoxy)-2-hydroxypropylmethacrylate, 3-(glycidyloxy-1-isopropyloxy)-2-hydroxypropylacrylate, and 3-(glycidyloxy-2-hydroxypropyloxy)-2-hydroxypropylacrylate. Among these, glycidyl acrylate and glycidyl methacrylate are preferable. These (meth)acrylic group/epoxy group-containing monomers may be used alone or in combination of two or more, depending on the intended coating resin.

The polymerizable composition containing a non-radical polymerizable monomer having a (meth)acrylic group may contain a crosslinking agent as its polymer is crosslinked. A compound having two or more epoxy groups in a molecule can be used as the crosslinking agent.

The surface-treated sol-gel silica of the present embodiment preferably have an average particle size of 0.05 μm or more and 2 μm or less, and more preferably 0.1 μm or more and 1.5 μm or less, as measured by laser diffraction scattering. When the average particle size is larger than this range, it is difficult to accurately reduce agglomerates in a later process. Moreover, surface-treated sol-gel silica with such a large average particle size is not suitable for filling of resin compositions for electronic materials. Particles with small particle sizes and large specific surface areas typically tend to agglomerate together. When the average particle size is smaller than the above range, it is difficult to reduce agglomeration of particles, and it is difficult to crush the formed agglomerates, resulting in coarse particles. Moreover, particles with such small particle sizes leads to increased viscosity and thus reduced fluidity of a resin etc. filled with the surface-treated sol-gel silica.

The content of particles with particle sizes of 5 μm or more in the surface-treated sol-gel silica of the present embodiment is 10 ppm or less, and preferably 6 ppm or less, in the particle number size distribution obtained by a Coulter counter method. In the case where the content of particles with particle sizes of 5 μm or more is more than 10 ppm in the particle number size distribution obtained by the Coulter counter method, a resin composition containing this surface-treated sol-gel silica has reduced fluidity. In the case where such a resin composition is used in applications for semiconductor encapsulants or applications for sealants for liquid crystal, gap penetrability of the resin composition is reduced due to coarse particles and clogging between wirings cannot be reduced.

For similar reasons, the content of particles with particle sizes of 3 μm or more is preferably 10 ppm or less, and more preferably 6 ppm or less, in the particle number size distribution obtained by the Coulter counter method.

The Coulter counter method is a method for measuring the particle diameter by an electrical resistance method called the Coulter Principle. Specifically, with electrodes placed on both sides of an aperture (pore) of an aperture tube in an electrolyte, a current is applied between the electrodes, particles to be measured are suspended in the electrolyte, and the electrolyte is sucked by a manometer from the inside of the aperture tube. As the particles pass through the aperture, the amount of electrolyte in the aperture which corresponds to the volume of the particles is replaced with the particles, and the electrical resistance between the electrodes changes accordingly. Since this change in electrical resistance is proportional to the volume of the particles passing through the aperture, the change in electrical resistance is detected and the particle diameters are calculated.

Typical examples of a method for quantifying the content of coarse particles with a size on the order of micrometers include particle size distribution measurement using laser diffraction scattering, SEM observation, and a wet sieving process using an electric sieve. In the SEM observation, only a limited number of particles are within each field of view and therefore it is inefficient to observe and quantify coarse particles with a size on the order of several parts per million. In the particle size distribution measurement using laser diffraction scattering, the silica content of a sample that is used for measurement is limited in order to avoid multiple scattering. Moreover, this measurement method has low detection sensitivity as particles are detected in percentages as described in Japanese Unexamined Patent Publication No. 2008-19157. This measurement method is therefore not suitable for, e.g., quantifying a very small number of particles with particle sizes of 5 μm or more in silica fine particles as in the present embodiment.

The content of particularly coarse particles with particle sizes of 20 μm or more in the surface-treated sol-gel silica of the present embodiment is preferably 5 ppm or less, and more preferably 4 ppm or less, which is close to "substantially free from such particularly coarse particles" in the particle size distribution obtained by the Coulter counter method.

The wet sieving process using an electric sieve can quantify the amount of coarse particles with small particle sizes. However, due to the material of the electric sieve, the wet sieving process does not like the use of organic solvents. The wet sieving process is therefore not suitable for measuring coarse particles in hydrophobic surface-treated sol-gel silica. As specifically described in examples later, even in the case where no coarse particle is detected by the particle size distribution measurement using laser diffraction scattering, there are coarse particles that are detected when quantified by the particle size distribution measurement using a Coulter counter. In the present application, it was found that the presence of such coarse particles would reduce the fluidity of the resin composition and would contribute to hindering improvement in yield in applications for semiconductor encapsulants and sealants for liquid crystal.

The coefficient of variation, which is one of indices of the spreading of the particle size distribution, of the surface-treated sol-gel silica of the present embodiment is preferably 40% or less, more preferably 25% or less, and particularly preferably 20% or less. When the coefficient of variation is larger than this range, the particle size distribution is broad, and the surface-treated sol-gel silica contains an increased number of fine particles as compared to powder having the same average particle size. Such an increase in number of fine particles leads to increased viscosity of a resin etc. filled with the surface-treated sol-gel silica, as is also described above. The coefficient of variation for sol-gel silica is typically 10% or more. The coefficient of variation can be measured by laser diffraction scattering.

In the surface-treated sol-gel silica of the present embodiment, the silanol group content of the sol-gel silica surface before surface treatment is 15 to 25 μmol/m² (9 to 15 silanol groups/nm²) when not baked, and is 5 to 8 μmol/m² (3 to 5 silanol groups/nm²) when baked. The smaller the surface silanol group content of the surface-treated sol-gel silica is, the more preferable because the surface-treated sol-gel silica adsorbs less moisture during storage and thus has improved stability over time. The surface silanol group content of the surface-treated sol-gel silica is normally 6 to 12 silanol groups/nm² when not baked and is normally 0 to 2 silanol groups/nm² when baked.

It is preferable that α radiation of the surface-treated sol-gel silica of the present embodiment be 0.002 c/(cm²·h) or less. It is known that surface-treated sol-gel silica with high α radiation contributes to causing soft errors such as reversal of charge stored in a memory cell, when used to fill a resin composition for electronic materials. With miniaturization, high integration, and 3D packaging of semiconductor packages, the influence of α radiation from fillers is getting stronger, and low α radiation fillers are desired.

Examples of impurities that emit α radiation include uranium (U) and thorium (Th). The U and TH contents of the surface-treated sol-gel silica powder of the present embodiment is preferably 0.1 ppb or less, more preferably 0.05 ppb or less, and particularly preferably 0.02 ppb or less. Uranium and thorium are quantified by measurement using ICP mass spectrometry, the lower detection limit is 0.01 ppb.

It is preferable that the surface-treated sol-gel silica of the present embodiment contain 10 ppm or less of Fe, 10 ppm or less of Al, 5 ppm or less of Na, 5 ppm or less of K, and 1 ppm or less of chloride ions. It is also preferable that the surface-treated sol-gel silica of the present embodiment contain 5 ppm or less of Ca, 5 ppm or less of Cr, 5 ppm or less of Ni, and 5 ppm or less of Ti. It is suitable that the surface-treated sol-gel silica of the present embodiment contain the impurities in the above ranges because such a surface-treated sol-gel silica reduces short-circuiting between metal wirings and corrosion of the metal wirings etc. which are caused by the silica particles when the surface-treated sol-gel silica is used as a filler for semiconductor encapsulants. Of the above impurities, the chloride ions are quantified by measurement using ion chromatography, and the elements other than the chloride ions are quantified by measurement using ICP emission spectrometry.

Of the above impurities, uranium (U) and thorium (Th) are derived from a raw material, and Fe, Al, Cr, Ni, and Ti are derived not only from a raw material but also from worn debris from a reaction vessel, piping, a crusher, etc. Na, K, Ca, and the chloride ions are often derived from the atmosphere.

The surface-treated sol-gel silica of the present embodiment do not contain coarse particles, and according to the properties modified by the surface treatment, a resin filled with the surface-treated sol gel silica has high fluidity. This surface-treated sol-gel silica can thus be suitably used to fill a resin composition for electronic materials and can be particularly suitably used in applications for semiconductor encapsulants and applications for sealants for liquid crystal. The resin composition has high fluidity when melted and is less likely to form fish eyes or projections in a molded article. Such properties of the resin composition can be suitably used in applications for various molded articles.

The type of resin to which the surface-treated sol-gel silica is added is not particularly limited. The type of resin can be selected as appropriate according to a desired application. Examples of the resin include an epoxy resin, an acrylic resin, a silicone resin, an olefin resin, a polyimide resin, and a polyester resin.

For example, an epoxy resin, an acrylic resin, a silicone resin, etc. are preferable for applications for semiconductor encapsulants and applications for sealants for liquid crystal. An olefin resin (polypropylene, polyethylene, polystyrene, etc.), a polyimide resin, a polyester resin, etc. are preferable for applications for films.

The amount of surface-treated sol-gel silica to be added to the resin composition is adjusted as appropriate according to the application and purpose. Specifically, when used in applications for semiconductor encapsulants, 65 to 900 parts by mass of the surface-treated sol-gel silica per 100 parts by mass of the resin is preferably added to the resin component. When used in applications for sealants for liquid crystal, 1 to 40 parts by mass of the surface-treated sol-gel silica per 100 parts by mass of the resin is preferably added to the resin component. When used in applications for films, 0.01 to 1 part by mass of the surface-treated sol-gel silica per 100 parts by mass of the resin is preferably added to the resin component. The resin component may contain other filler in addition to the surface-treated sol-gel silica of the present embodiment.

The surface-treated sol-gel silica of the present embodiment does not contain coarse particles and can therefore be suitably used as an external additive for toner or a filler for dental materials.

<Method for Producing Sol-Gel Silica>

The sol-gel silica of the present embodiment is sol-gel silica obtained by a sol-gel process. A method for producing this sol-gel silica is not limited to a specific method as long as the produced sol-gel silica satisfies the above prescribed requirements. The sol-gel process herein refers to a process in which silicon alkoxide is subjected to hydrolysis and polycondensation in a reaction medium comprised of water containing a catalyst and an organic solvent, silica sol thus produced is gelled, and the solid produced is then taken out and dried to produce sol-gel silica. In the present embodiment, the sol-gel silica obtained by drying the solid can also be baked as necessary.

Specifically, a production method (I) including the following steps (1) to (5) is a preferred form of the production method.

(1) The step of producing a sol-gel silica dispersion having dispersed therein sol-gel silica particles produced by a sol-gel process with an average particle size of 0.05 to 2.0 μm as measured by laser diffraction scattering (hereinafter sometimes referred to as the sol-gel silica dispersion production step).

(2) The step of adding a surface treatment agent to the sol-gel silica dispersion to treat the surfaces of the sol-gel silica particles by wet surface treatment (hereinafter sometimes referred to as the dispersion silica particle surface treatment step).

(3) The step of wet-filtering the sol-gel silica dispersion using a filter medium with a pore size of 5 μm or less (hereinafter sometimes referred to as the sol-gel silica dispersion wet filtration step).

(4) The step of adding a coagulating agent, which is comprised of at least one compound selected from the group consisting of carbon dioxide, ammonium carbonate, ammonium bicarbonate, and ammonium carbamate, to the wet-filtered sol-gel silica dispersion to coagulate the silica particles and thus produce a coagulated silica dispersion having the sol-gel silica particles coagulated therein (hereinafter sometimes referred to as the coagulation step).

(5) The step of separating the sol-gel silica particles from the coagulated silica dispersion by solid-liquid separation and drying the sol-gel silica.

A production method (II) including the following steps (1), (3) to (5), and (6) to (8) is a preferred form of the production method further including a baking step.

(1) The step of producing a sol-gel silica dispersion having dispersed therein sol-gel silica particles produced by a sol-gel process with an average particle size of 0.05 to 2.0 μm as measured by laser diffraction scattering.

(3) The step of wet-filtering the sol-gel silica dispersion using a filter medium with a pore size of 5 μm or less.

(4) The step of adding a coagulating agent, which is comprised of at least one compound selected from the group consisting of carbon dioxide, ammonium carbonate, ammonium bicarbonate, and ammonium carbamate, to the wet-filtered sol-gel silica dispersion to coagulate the silica particles and thus produce a coagulated silica dispersion having the sol-gel silica particles coagulated therein.

(5) The step of separating the sol-gel silica particles from the coagulated silica dispersion by solid-liquid separation and drying the sol-gel silica particles.

(6) The step of baking the dried sol-gel silica particles to produce baked silica particles (hereinafter sometimes referred to as the baking step).

(7) The step of treating the surfaces of the baked silica particles by dry surface treatment using a surface treatment agent to produce surface-treated baked silica particles (hereinafter sometimes referred to as the baked silica particle surface treatment step).

(8) The step of dispersing the surface-treated baked silica particles in a solvent to produce a dispersion, wet-filtering the dispersion using a filter medium with a pore size of 5 μm or less, and then separating the surface-treated baked silica particles from the filtrate by solid-liquid separation and drying the surface-treated baked silica particles (hereinafter sometimes referred to as the baked silica wet-filtration/solid-liquid separation/drying step).

A suitable method for producing the surface-treated sol-gel silica of the present embodiment will be described in detail below.

(1) Sol-Gel Silica Dispersion Production Step

In the production method of the present embodiment, a sol-gel silica dispersion is produced which has dispersed therein sol-gel silica particles produced by a sol-gel process with an average particle size of 0.05 to 2.0 μm as measured by laser diffraction scattering.

<Silicon Alkoxide>

As silicon alkoxide, any compound that is used to produce silica particles using the reaction of the sol-gel process can be used without any particular limitation.

In the present embodiment, examples of silicon alkoxide (alkoxysilane) include methyltrimethoxysilane, methyltriethoxysilane, tetramethoxysilane, tetraethoxysilane, tetraisopropoxysilane, and tetrabutoxysilane. Among these, methyltrimethoxysilane, tetramethoxysilane, and tetraethoxysilane are more preferable because they are industrially easily available and easy to handle. These silicon alkoxides may be used alone or in combination of two or more.

In order to produce sol-gel silica with reduced impurity content, it is preferable to use high purity silicon alkoxide. Specifically, in the case where sol-gel silica having a U content of 0.1 ppb or less and a Th content of 0.1 ppb or less is produced by using tetramethoxysilane as silicon alkoxide as a raw material, it is preferable to use tetramethoxysilane having a U content of 0.2 ppb or less and a Th content of 0.2 ppb or less.

In order to produce high purity silicon alkoxide, a raw material may be purified in advance by distillation etc.

In the case where silicon alkoxide is liquid at normal temperature and pressure, the silicon alkoxide may be used as it is or may be diluted with an organic solvent described below before use. In the case where silicon alkoxide is solid at normal temperature and pressure, the silicon alkoxide can be dissolved or dispersed in an organic solvent before use.

<Catalyst>

When producing silica particles by a sol-gel process, an acidic catalyst is used in some cases. However, it is preferable to use a basic catalyst in the present embodiment because it is easy to produce spherical particles with a uniform particle size. In the case where silicon alkoxide is first subjected to preliminary hydrolysis under a basic catalyst and then particles are grown, it is preferable to use a method in which a basic catalyst during growth of the particles.

The basic catalyst that is used in the present embodiment is not particularly limited. Any known basic catalyst that is used to produce silica particles using the reaction of the sol-gel process can be suitably used.

Examples of such a basic catalyst include an amine compound and an alkali metal hydroxide. It is particularly suitable to use an amine compound because it contains a small amount of impurities containing a metal(s) other than the metal elements forming intended sol-gel silica and high purity sol-gel silica can be produced by using the amine compound. Examples of such an amine compound include ammonia, methylamine, dimethylamine, trimethylamine, ethylamine, dimethylamine, and trimethylamine Among these, it is particularly preferable to use ammonia because it is highly volatile and easy to remove, the reaction rate of the sol-gel process is high, etc.

These basic catalysts may be used alone or in combination of two or more.

As the basic catalyst, an industrially available basic catalyst may be used as it is (in the form as purchased or acquired) or may be diluted with water or an organic solvent before use like, e.g., ammonia water etc. It is particularly preferable to use a basic catalyst diluted with water, namely an aqueous solution of the basic catalyst having a concentration adjusted as necessary, because it is easy to control the rate at which the reaction progresses. In the case where such an aqueous solution of the basic catalyst is used, it is preferable that the concentration of the aqueous solution be 1 to 30 mass % because the basic catalyst is industrially easily available and it is easy to control the concentration.

The proportion of the basic catalyst is determined as appropriate in view of hydrolysis of silicon alkoxide, the reaction rate of the polycondensation reaction, etc. The proportion of the basic catalyst in a reaction solution is preferably 0.1 to 60 mass %, and more preferably 0.5 to 40 mass %, relative to the mass of silicon alkoxide that is used.

<Solvent>

In the present embodiment, a polar solvent is preferable as a solvent to be used for the hydrolysis and polycondensation reaction of silicon alkoxide. The polar solvent herein refers to either an organic solvent that dissolves 10 g or more of water per 100 g of the organic solvent at normal temperature and pressure or water. A mixture of a plurality of types of organic solvents other than water may be used. In this case, this mixture of organic solvents need only satisfy the above requirements.

Examples of the organic solvent that is a polar solvent other than water include alcohols such as methanol, ethanol, isopropyl alcohol, and butanol, ethers such as tetrahydrofuran and dioxane, and amide compounds such as dimethylformamide, dimethylacetamide, and N-methylpyrrolidone.

Since alcohol is a byproduct of the reaction of the sol-gel process, it is particularly preferable to use alcohol such as methanol, ethanol, isopropyl alcohol, or butanol because the use of alcohol reduces unnecessary contamination of the sol-gel silica dispersion after the reaction with impurities and alcohol is easy to remove by heating.

These organic solvents and water may be used alone or as a mixture of two or more solvents.

The proportion of the organic solvent or water is determined as appropriate according to the particle size of the intended sol-gel silica particles and a desired value of the concentration of the sol-gel silica particles in the sol-gel silica dispersion after the reaction of the sol-gel process. For example, in the case where alcohol is used as the organic solvent, the proportion of alcohol to the mass (100 mass %) of the sol-gel silica dispersion obtained by the reaction of the sol-gel process is preferably in the range of 10 to 90 mass %, and more preferably in the range of 15 to 80 mass %.

Water is essential for the water reaction of the sol-gel process (such a polar solvent that dissolves water as described above is therefore used). In the case where the basic catalyst is added as a solution and in the case where water is used as a part or all of the solvent, it is not necessary to further add water to the reaction solution. In other cases, however, water required for the sol-gel reaction needs to be further added to the reaction solution.

The proportion of water is adjusted and selected as appropriate according to the particle size of the sol-gel silica particles to be produced. When the proportion of water is too small, the reaction rate is reduced. When the proportion of water is too large, it takes long to perform a drying process (remove the solvent). The proportion of water is therefore selected in view of both the reaction rate and the time required to perform the drying process. The proportion of water to the total mass of the sol-gel silica dispersion produced by the reaction of the sol-gel process is preferably in the range of 2 to 50 mass %, and more preferably in the range of 5 to 40 mass %.

Water may be used as a part or all of the reaction solvent or may be added to the reaction solution after all the reaction raw materials other than water are prepared. However, in order to cause the reaction of the sol-gel process to proceed quickly or stably, it is preferable to use water as a part of the solvent, namely to use a mixture of water and an organic solvent as the solvent. Water as the solvent herein includes the case where water is added with addition of a basic catalyst etc.

<Reaction Apparatus for Sol-Gel Silica Synthesis>

As a reaction apparatus used in the present embodiment, any reactor having a stirrer is used without any particular limitation. As a stirring blade for the stirrer, known stirring blades are used without any particular limitation. Typical examples of the stirring blade include a tilted paddle blade, a turbine blade, a 3-wept back blade, an anchor blade, a Fullzone blade, a Twinstir blade, and a Maxblend blade.

As the reactor having such a stirrer, a reactor with a common shape, namely a hemispherical reactor or a flat bottom or round bottom cylindrical reactor, and a reactor having a baffle plate placed therein can be used without any particular limitation. The material of the reactor is not particularly limited, and a reactor made of glass, a metal such as stainless steel (including a glass-coated or resin-coated metal), or a resin can be used. In order to produce sol-gel silica with reduced impurities described above, it is preferable that the reactor is made of a material with high abrasion resistance.

Although the stirring efficiency of the reactor that is used in the present embodiment is not particularly limited, it is desirable to use a reactor whose dimensionless mixing time $n\theta m$ (where n represents the rotational speed (1/s) of the stirring blade and $\theta s$ represents the mixing time (s)) is 100. The reactor whose dimensionless mixing time $n\theta m$ is within this range can keep a reaction solution uniform during the reaction, and sol-gel silica having a more uniform particle size and narrow particle size distribution can be produced.

Reactors that handles 50 L or more of a reaction solution in the industrial practice described later often have stirring efficiency in the above range.

The dimensionless mixing time $n\theta m$ is the product of the rotational speed n (1/s) of the stirring blade and the mixing time $\theta m$ (s). When the stirring Reynolds number is constant, the dimensionless mixing time $n\theta m$ is uniquely determined regardless of the scale of the reactor and is therefore a very useful index of the stirring efficiency. θm typically represents the time it takes until a tracer substance is uniformly mixed. The mixing time θm is affected by the reactor shape, whether the baffle plate is present or not and how the baffle plate is placed, the type of stirring blade and the rotational speed thereof, viscoelastic properties of a liquid to be mixed, etc.

In the case where the dimensionless mixing time nθm is smaller than 55, the reactor has high stirring efficiency and can sufficiently stir the reaction solution, and adhesion and agglomeration of particles are less likely to occur. In the case where the dimensionless mixing time nθm is 55 to 100, adhesion and agglomeration of particles can be reduced by adding a silicon alkoxide solution to the reaction solution at a linear velocity of discharge flow of 30 mm/s to 1000 mm/s. In the case where the dimensionless mixing time nθm is larger than 100, the reactor has very low stirring efficiency, and therefore mixing is not sufficient. Accordingly, the reaction solution is not uniform, and adhesion and agglomeration of particles are therefore more likely to occur.

<Conditions for Sol-Gel Silica Synthesis Reaction>

As described above, the hydrolysis and polycondensation reaction (the reaction of the sol-gel process) of the present embodiment are usually caused in the presence of a basic catalyst. Known conditions can be used as reaction conditions. A method for bringing silicon alkoxide and the basic catalyst into contact each other is not particularly limited. The reaction conditions and the method for bringing silicon alkoxide and the basic catalyst into contact each other are selected and determined as appropriate in view of the configuration of the reaction apparatus and the reaction scale so that sol-gel silica powder having desired particle size distribution is produced.

A specific example of a method for causing the reaction of the sol-gel process is as follows.

Water, a polar solvent (organic solvent) other than water, and a basic catalyst are placed in a reaction vessel, and silicon alkoxide (or a solution of silicon alkoxide and an organic solvent) and an aqueous solution of a basic catalyst are simultaneously added thereto. This method is preferable as it has satisfactory reaction efficiency and spherical silica particles with a uniform particle size can be efficiently produced with high reproducibility. In this case, for example, a part of silicon alkoxide may first be added and the remaining silicon alkoxide and the basic catalyst may then be added simultaneously. In the case where two or more silicon alkoxides are used, the silicon alkoxides may be mixed and added simultaneously, or the silicon alkoxides are sequentially added one by one.

When adding silicon alkoxide and the basic catalyst, it is preferable to add silicon alkoxide and the basic catalyst under the surface of the reaction solution. The expression "added under the surface of the reaction solution" means that the raw materials are added to the reaction solution with a tip end of an inlet port being immersed in the reaction solution. It is desirable that the tip end of the inlet port be located at a position where stirring is sufficiently performed and the added materials can be quickly diffused in the reaction solution, such as near stirring blades.

The addition time for silicon alkoxide and the basic catalyst (the time from the start to the end of addition) is a very important factor in production of particles with narrow particle size distribution. When the addition time is too short, the particle size distribution tends to become broader. When the addition time is too long, particles cannot stably grow. In order to produce sol-gel silica particles with narrow particle size distribution and a uniform particle size, it is necessary to select and use the addition time suitable for particles to grow. Especially, in order to produce silica particles with satisfactory monodispersity, it is preferable to add a raw material such as silicon alkoxide at a linear velocity of discharge flow of 30 mm/s to 1000 mm/s. In view of the above, the addition time is preferably in the range of 0.2 to 8 hours per 100 nm of a desired particle size.

The reaction temperature is not particularly limited as long as it is a temperature at which the reaction of the sol-gel process proceeds quickly according to the type of raw material used. The reaction temperature is selected as appropriate according to the particle size of the intended sol-gel silica particles. In order to produce sol-gel silica particles with an average particle size of 0.05 to 2.0 μm, the reaction temperature is selected as appropriate within the range of −10 to 60° C.

In order to reliably cause the reaction of the sol-gel process to proceed, the dispersion may be aged (let stand for a certain time until the subsequent step) after the addition of silicon alkoxide and the basic catalyst is completed. I this case, the aging temperature is about the same temperature as the reaction temperature, namely −10 to 60° C., and the aging time is preferably 0.25 to 5 hours.

In order to produce sol-gel silica particles with a desired particle size, silicon alkoxide and the basic catalyst may be added after aging to grow the particle size of the sol-gel silica particles.

<Sol-Gel Silica Dispersion>

A sol-gel silica dispersion having dispersed therein sol-gel silica particles produced by the sol-gel process with an average particle size of 0.05 to 2.0 μm as measured by laser diffraction scattering is produced by the method described above. The sol-gel silica particles in the dispersion are present dispersed in a mixed solvent of the polar solvent used and alcohol produced by hydrolysis of silicon alkoxide.

The sol-gel silica particles in the dispersion are monodispersed uniformly substantially without causing adhesion and agglomeration of particles. However, due to the reaction proceeding excessively locally, aggregation, etc., a slight amount of coarse independent primary particles with particle sizes of 5 μm or more (hereinafter simply referred to as the "coarse independent primary particles") is also present in the dispersion. Specifically, the produced sol-gel silica contains about 15 to 1000 ppm of coarse independent primary particles in the particle number size distribution. When such coarse independent primary particles remain in the final surface-treated sol-gel silica, they may cause reduction in fluidity of the resin component or reduction in strength of the cured resin composition.

When the proportion of the sol-gel silica particles in the sol-gel silica dispersion is too high, the dispersion has high viscosity and therefore is difficult to handle. When the proportion of the sol-gel silica particles in the sol-gel silica dispersion is too low, a less amount of sol-gel silica is produced in a single reaction, which is economically disadvantageous. In view of this, the concentration of the silica particles in the produced sol-gel silica dispersion is preferably 1 to 40 mass % and particularly preferably 2 to 25 mass %. It is therefore preferable to adjust the amount of polar solvent, especially the polar solvent other than water, so that the concentration of the sol-gel silica particles is adjusted to the above range. For example, in the case where the dispersion produced by the reaction of the sol-gel process is difficult to handle due to high proportion of the sol-gel silica particles in the dispersion, it is preferable to adjust the concentration by adding the polar solvent before (3) the dispersion wet-filtration step or before the dispersion sol-gel silica particle surface treatment step (2) that is performed as necessary.

(2) Dispersion Silica Particle Surface Treatment Step

When producing the surface-treated sol-gel silica using the production method (I), a surface treatment agent is added to the sol-gel silica distribution produced in the sol-gel silica dispersion production step (1) to surface treat the silica particles. The surface treatment agent is preferably at least one selected from silicone oil, silane coupling agents, siloxanes, and silazanes.

In the production method (II) in which the silica particles are baked in a later step, the surface treatment agent introduced into the sol-gel silica surface in the step (2) decompose and disappear during baking. Accordingly, the step (2) is not essential for the production method (II). However, it is suitable that the production method (II) include the step (2) as it provides the effects described later.

Performing surface treatment in the step (2) is preferable as it not only provides a capability derived from the surface treatment agent to the silica particles in the production method (I) but also allows the solid-liquid separation step described later to be efficiently performed in the production method (II). Since such surface treatment reduces formation of strong agglomerates during drying. The produced sol-gel silica particles can therefore be used in various applications without requiring any special crushing process.

It is necessary to perform the surface treatment step before the sol-gel silica dispersion wet filtration step (3) in order to accurately reduce the coarse independent primary particles in the silica dispersion after the sol-gel reaction. The agglomerates formed during the surface treatment in the step (2) and the residue of the surface treatment agent can thus be reduced in the sol-gel silica dispersion wet filtration step (3).

Specific examples of the silicone oil, the silane coupling agent, siloxanes, and silazanes can be selected and used as appropriate from those described above according to the required capability of the surface treated sol-gel silica particles.

The proportion of the silicone oil is not particularly limited. However, when the proportion of the silicone oil is too low, the surface treatment is not sufficiently performed. When the proportion of the silicone oil is too high, post-treatment is complicated. Moreover, when an excessive amount of silicone oil is present on the sol-gel silica surface, agglomeration is increased. The proportion of the silicone oil is therefore preferably 0.05 to 80 parts by mass, more preferably 0.1 to 60 parts by mass, and most preferably 1 to 20 parts by mass, per 100 parts by mass of the sol-gel silica powder used.

The proportion of the silane coupling agent is not particularly limited. However, when the proportion of the silane coupling agent is too low, the surface treatment is not sufficiently performed. When the proportion of the silane coupling agent is too high, post-treatment is complicated. Moreover, when an excessive amount of silane coupling agent is present on the sol-gel silica surface, agglomeration is increased. The proportion of the silane coupling agent is therefore preferably 0.05 to 80 parts by mass, more preferably 0.1 to 40 parts by mass, and most preferably 0.5 to 5 parts by mass, per 100 parts by mass of the sol-gel silica powder used.

The proportion of the siloxanes is not particularly limited. However, when the proportion of the siloxanes is too low, the surface treatment is not sufficiently performed. When the proportion of the siloxanes is too high, post-treatment is complicated. Moreover, when an excessive amount of siloxanes is present on the sol-gel silica surface, agglomeration is increased. The proportion of the siloxanes is therefore preferably 0.1 to 150 parts by mass, more preferably 1 to 120 parts by mass, and most preferably 2 to 60 parts by mass, per 100 parts by mass of the sol-gel silica powder used.

Preferred Examples of the silazanes include tetramethyldisilazane, hexamethyldisilazane, and heptamethyldisilazane.

The proportion of the silazanes is not particularly limited. However, when the proportion of the silazanes is too low, the surface treatment is not sufficiently performed. When the proportion of the silazanes is too high, post-treatment is complicated. Moreover, when an excessive amount of silazanes is present on the sol-gel silica surface, agglomeration is increased. The proportion of the silazanes is therefore preferably 0.1 to 150 parts by mass, more preferably 1 to 120 parts by mass, and most preferably 2 to 60 parts by mass, per 100 parts by mass of the sol-gel silica powder used.

These surface treatment agents may be used alone or may be used in combination of two or more.

Among such surface treatment agents as described above, it is preferable to use at least one selected from the group consisting of silane coupling groups and silazanes and it is more preferable to use silazanes, because the resultant surface-treated sol-gel silica has high fluidity and the later solid-liquid separation step can be efficiently performed, and formation of strong agglomerates during drying can be effectively reduced. In the case where a surface treatment agent selected from the group consisting of silane coupling agents and silazanes is used, the proportion of the surface treatment agent is preferably 0.2 to 2 times, and more preferably 0.5 to 1 times, the silanol group content of the sol-gel silica surface in order to particularly reduce agglomeration.

A method for adding the surface treatment agent is not particularly limited. In the case where the surface treatment agent is a low viscosity liquid at normal temperature and pressure, the surface treatment agent need only be added to the dispersion. In the case where the surface treatment agent is a high viscosity liquid or solid, the surface treatment agent is added to an appropriate organic solvent to produce a solution or dispersion, and the solution or dispersion is added to the dispersion in a manner similar to that of the low viscosity liquid.

Known solvents that do not affect the functional group of the surface treatment agent to be used can be used as the organic solvent. Specific examples of the organic solvent include solvents similar to those described in the sol-gel silica dispersion production step (1).

In the case where the surface treatment agent is gaseous, the surface treatment agent can be blown into the dispersion to produce fine foam in the dispersion.

The surface treatment temperature is determined in view of the reactivity of the surface treatment agent to be used. When the surface treatment temperature is too low, the reaction proceeds slowly. When the surface treatment temperature is too high, the operation is complicated. The surface treatment temperature is therefore preferably 10 to 100° C., and more preferably 20 to 80° C.

The surface treatment time is not particularly limited and is determined in view of the reactivity, treatment temperature, etc. of the surface treatment agent to be used. In order to cause the surface treatment reaction to proceed sufficiently and in order to reduce the process time, the surface treatment time is preferably 0.1 to 48 hours, and more preferably 0.5 to 24 hours.

(3) Surface-Treated Sol-Gel Silica Dispersion Wet Filtration Step

In the method of the present embodiment, the sol-gel silica dispersion resulting from the sol-gel reaction is wet-filtered to remove the coarse independent primary particles from the dispersion. The sol-gel silica dispersion having the coarse particles removed therefrom is thus obtained as filtrate. That is, by wet-filtering the sol-gel silica dispersion, the coarse independent primary particles, and particles adhering to each other or agglomerates, if any, are separated and caught on the filter medium. In the case where the dispersion silica particle surface treatment step (2) is included in the production method, the step (2) is performed after the surface treatment, so that the agglomerates formed during the surface treatment and the residue of the surface treatment agent are also separated.

As the filter medium for the filtration, filter media with a pore size of 5 µm or less can be used without any particular limitation, and a filter medium with a pore size of 3 µm or less is preferred. When the pore size is too small, the filtering capability of the filter medium is significantly reduced. The lower limit of the pore size is therefore usually 1 µm although it depends on the average particle size of the intended sol-gel silica or surface-treated sol-gel silica.

In the present embodiment, the pore size of the filter medium is measured using size standard particles (for each average particle size, the standard deviation is the average particle size×2% or less). The pore size of the filter medium thus measured means such a pore size that the filter medium can capture 99 mass % or more of standard particles of each average particle size and can capture only less than 99 mass % of standard particles of particle sizes smaller than the average particle size. In this measurement, water containing 0.5 mass % of size standard particles is passed through the filter medium at 1 L/min, the slurry having passed through the filter medium is dried at 200° C. for 8 hours to remove the solvent, and the residual solid content is measured. The capture rate of the size standard particles is thus calculated from the amount of slurry and the residual content. The size standard particles are preferably functional nano/micro particles made by Thermo Fisher Scientific Inc. For example, model No. 4205A is used as size standard particles with a particle size of 5 µm, and model No. 4203A is used as size standard particles with a particle size of 3 µm.

The material of the filter is not particularly limited. Examples of the material of the filter include a resin (polypropylene, PTFE, etc.) and a metal. In order to prevent contamination with metal impurities, it is preferable to use a resin filter.

Another method for removing coarse particles is to perform dry sieving as a final step after the surface-treated sol-gel silica is produced. However, it is difficult to remove with particle sizes of several micrometers by dry sieving because it causes clogging and therefore is not efficient.

In the production method (II) including the baking step, wet filtration is performed again after surface treatment of the baked silica particles. It is important to perform wet filtration before the baking step to remove coarse independent primary particles and strong agglomerates formed in the sol-gel silica dispersion production step (1) and the dispersion silica particle surface treatment step (2). If such coarse particles are present in the sol-gel silica in the baking step, more strong agglomerates will form from these coarse particles in the surface treatment of the baked silica particles, as described below. As a result, in the wet filtration following the surface treatment of the baked silica particles, sieves with small openings tend to be clogged, making it industrially difficult to perform this wet filtration.

(4) Coagulation Step

In the method of the present embodiment, the sol-gel silica dispersion thus obtained as filtrate is then coagulated.

The coagulation step is performed with a coagulating agent added to the dispersion of the sol-gel silica or surface-treated sol-gel silica resulting from the wet filtration, and the coagulating agent is made of at least one compound selected form the group consisting of carbon dioxide, ammonium carbonate, ammonium bicarbonate, and ammonium carbamate. Since the dispersion contains such a coagulating agent, loose aggregates of the sol-gel silica or surface-treated sol-gel silica particles are formed in the dispersion. These aggregates can be stably present in the dispersion due to the coagulating agent or its derivative in the dispersion and therefore can be easily recovered by the filtration.

The above coagulating agents are easily decomposed and removed by slight heating. These coagulating agents therefore facilitate production of high purity sol-gel silica or surface-treated sol-gel silica. According to the method of the present embodiment, the sol-gel silica or surface-treated sol-gel silica containing, e.g., 100 ppm or less of sodium elements, and more preferably 10 ppm or less of sodium elements, can be produced.

A technique in which a metal salt is added to the dispersion of the sol-gel silica or the surface-treated sol-gel silica particles to form aggregates of the particles is known in the art. In the case where, e.g., a sodium salt, a potassium salt, etc. is used, the resultant sol-gel silica or surface-treated sol-gel silica may contain a metal element component of the salt. In this case, a washing (purifying) operation is required to remove the metal element component, which is industrially disadvantageous. Moreover, the aggregates have strong aggregation properties and therefore cannot be broken into primary particles by a simple crushing process. Accordingly, the aggregates may remain as coarse particles in the sol-gel silica or surface-treated sol-gel silica.

The proportion of the coagulating agent and the method for adding the coagulating agent can be determined as follows according to the type of coagulating agent to be used. The proportion of the coagulating agent is determined in view of the balance between the degree to which loose aggregates of the sol-gel silica particles or surface-treated sol-gel silica particles are formed in the dispersion and the waste resulting from using an unreasonably large amount of raw material. The mass of the sol-gel silica or surface-treated sol-gel silica shown below as a basis of the proportion of the coagulating agent is a value calculated on the assumption that all the silicon alkoxides used have been subjected to hydrolysis and polycondensation to produce the sol-gel silica or the surface sol-gel silica.

In the case where carbon dioxide is used as the coagulating agent, the proportion of carbon dioxide is preferably 0.005 parts by mass or more, and more preferably 0.005 to 300 parts by mass, per 100 parts by mass of the sol-gel silica or surface treated sol-gel silica contained in the dispersion. The proportion of carbon dioxide to the sol-gel silica is even more preferably 0.05 parts by mass or more, particularly preferably 0.05 to 300 parts by mass, and more particularly preferably 0.25 to 200 parts by mass, per 100 parts by mass of the sol-gel silica powder. The proportion of carbon dioxide to the surface-treated sol-gel silica is even more preferably 15 parts by mass or more, particularly preferably 15 to 300 parts by mass, and more particularly preferably 17 to 200 parts by mass, per 100 parts by mass of the surface-treated sol-gel silica powder.

For example, carbon dioxide can be added by blowing carbon dioxide in a gaseous state into the dispersion or can be added in a solid state (dry ice). It is preferable to add carbon dioxide in a solid state due to its ease of operation.

In the case where ammonium carbonate, ammonium bicarbonate, or ammonium carbamate is used as the coagulating agent, the proportion of ammonium carbonate, ammonium bicarbonate, or ammonium carbamate is preferably 0.01 parts by mass or more, and more preferably 0.001 to 80 parts by mass, per 100 parts by mass of the sol-gel silica or surface-treated sol-gel silica contained in the dispersion. Specifically, in the case where the surface treatment of the silica particles in the dispersion is not performed in the step (2), the proportion of ammonium carbonate, ammonium bicarbonate, or ammonium carbamate is even more preferably 0.01 to 15 parts by mass, and particularly preferably 0.001 to 10 parts by mass, per 100 parts by mass of the sol-gel silica. In the case where the surface treatment of the silica particles in the dispersion is performed in the step (2), the proportion of ammonium carbonate, ammonium bicarbonate, or ammonium carbamate is even more preferably 15 parts by mass or more, and particularly preferably 20 to 50 parts by mass, per 100 parts by mass of the surface-treated sol-gel silica.

Ammonium carbonate, ammonium bicarbonate, or ammonium carbamate may be added in a solid state or may be added in the form of a solution of ammonium carbonate, ammonium bicarbonate, or ammonium carbamate and an appropriate solvent. The solvent that is used when adding ammonium carbonate, ammonium bicarbonate, or ammonium carbamate in the form of a solution is not particularly limited as long as the solvent dissolves ammonium carbonate, ammonium bicarbonate, or ammonium carbamate. However, water is preferable as the solvent as water has high dissolution capability and is easy to remove after filtration. The concentration of the ammonium carbonate, ammonium bicarbonate, or ammonium carbamate solution is not particularly limited as long as it is within such a range that ammonium carbonate, ammonium bicarbonate, or ammonium carbamate dissolves therein. When the concentration is too low, a larger amount of solution needs to be used, which is economically disadvantageous. The concentration is therefore preferably 2 to 15 mass %, and particularly preferably 5 to 12 mass %.

The coagulating agents may be used alone or in combination of two or more.

Especially, a mixture of ammonium bicarbonate and ammonium carbamate, which is commercially available as what is called "ammonium carbonate," can be used as it is or in the form of a solution of ammonium carbonate and an appropriate solvent. In this case, the total proportion of ammonium bicarbonate and ammonium carbamate, and the type of solvent and the concentration of the solution in the case where the mixture of ammonium bicarbonate and ammonium carbamate is used in the form of a solution, are similar to those described above for ammonium carbonate, ammonium bicarbonate, or ammonium carbamate.

For the pH of the dispersion of the sol-gel silica particles or surface treated sol-gel silica particles at the time of adding the coagulating agent, it is desired to select and set such a pH range that does not cause undesirable decomposition of the coagulating agent in the dispersion and that provides the effects of the present embodiment. In view of this, the pH of the dispersion is preferably in the alkaline range, and more preferably pH 9 or more.

For the temperature of the dispersion of the sol-gel silica particles or surface-treated sol-gel silica particles at the time of adding the coagulating agent, it is desired to select and set such a temperature that allows loose aggregates of the sol-gel silica particles or surface-treated sol-gel silica particles formed by addition of the coagulating agent to stably present in the dispersion. In view of this, the temperature of the dispersion is preferably −10 to 60° C., which is the same as the reaction temperature of the reaction of the sol-gel process, and more preferably 10 to 40° C.

It is preferable to age the dispersion after addition of the coagulating agent. Namely, it is preferable to let the dispersion stand for a certain time until filtration in the subsequent step. It is preferable to age the dispersion after addition of the coagulating agent as it facilitates the formation of loose aggregates of the sol-gel silica particles or surface treated sol-gel silica particles. The longer the aging time, the better. However, aging the dispersion for a too long time is economically disadvantageous. When the aging time is too short, loose aggregates of the sol-gel silica particles or surface treated sol-gel silica particles are not sufficiently formed. The aging time is therefore preferably 0.5 to 72 hours and particularly preferably 1 to 48 hours. The temperature of the dispersion during aging is not particularly limited. The temperature of the dispersion during aging can be in the same temperature range as the preferred temperature range of the dispersion at the time of adding the coagulating agent. The temperature of the dispersion during aging need only be the same as that of the dispersion at the time of adding the coagulating agent.

(5) Solid-Liquid Separation/Drying Step

In the method of the present embodiment, the step (5) is the step of recovering the sol-gel silica or the surface-treated sol-gel silica from the dispersion having the coagulating agent added thereto in the manner described above and preferably having been aged.

Means for separating the sol-gel silica or surface-treated sol-gel silica having loose aggregates formed by addition of the coagulating agent from the dispersion by solid-liquid separation is not particularly limited. However, the sol-gel silica or surface-treated sol-gel silica can be easily recovered as a residue. The filtration method is not particularly limited, and known filtration methods such as reduced pressure filtration, pressure filtration, or centrifugal filtration can be used.

Filter paper, filter cloth, etc. (hereinafter these are collectively referred to as the "filter paper etc.") for the filtration can be used without any particular limitation as long as they are industrially available. The filter paper etc. are selected as appropriate according to the scale of a separation apparatus (filter), the average particle size of silica to be recovered, etc. The filter paper etc. that are preferably used for the surface-treated sol-gel silica with particle sizes of 0.05 to 2 μm are filter paper with a retaining particle size of 5 μm or less, filter cloth with permeability of 1.5 cm³/(cm²·s) or less, etc. The surface-treated sol-gel silica is recovered as a cake by the solid-liquid separation.

According to the present embodiment, primary particles are loosely aggregated by addition of the coagulating agent, the pore size of the filter paper etc. can be significantly larger than the primary particle size. For example, the filter paper with a retaining particle size of 5 μm or less is enough for the sol-gel silica particles with an average particle size of 0.05 to 2.0 µm. Since the filter paper etc. with a large pore size is used, the filtration can be performed quickly.

The sol-gel silica or the surface-treated sol-gel silica is recovered as a cake by the filtration.

In the case where an aqueous solution of ammonium bicarbonate is used as the coagulating agent in the coagulation step, the cake obtained by the filtration is rinsed with an appropriate solvent such as water or alcohol. The solvent, basic catalyst, and unreacted surface treatment agent used in the reaction of the sol-gel process can thus be decomposed and removed.

Subsequently, the sol-gel silica or surface treated sol-gel silica thus recovered by the filtration step is dried.

In the present embodiment, the cake of the sol-gel silica or surface-treated sol-gel silica recovered as described above has improved crushability when dried at 35° C. or higher. It is therefore preferable that the drying temperature in the drying step of the present embodiment be 35° C. or higher. By heating at this temperature, the coagulating agent having not been removed by the rinsing etc. and still remaining in the cake can be easily removed by thermal decomposition.

The drying method is not particularly limited, and known drying methods such as air-blast drying or reduced pressure drying can be used. It is preferable to use the reduced pressure drying as the sol-gel silica or surface-treated sol-gel silica dried by this method tends to have higher crushability.

Drying at higher temperatures is more advantageous in view of the decomposition efficiency of the coagulating agent and in order to increase the crushability of the sol-gel silica or surface sol-gel silica. However, drying at too high drying temperatures is not preferable as agglomerates are sometimes formed by reactive substituents introduced into the surfaces of the sol-gel silica particles by the surface treatment. In order to balance therebetween, the drying temperature is preferably 35 to 200° C., more preferably 50 to 200° C., particularly preferably 80 to 200° C., and more particularly preferably 120 to 200° C.

The drying time is not particularly limited and is selected as appropriate according to the conditions for drying such as the drying temperature, pressure, etc. Drying for about 2 to 48 hours typically sufficiently dries the sol-gel silica or the surface-treated sol-gel silica.

In the present embodiment, instead of performing the filtration, the dispersion medium may be removed from the dispersion of the sol-gel silica or surface-treated sol-gel silica particles by concentration. That is, the concentration and the drying may be performed successively. For example, by vaporizing the dispersion medium by heating concentration, reduced pressure concentration, etc., the dispersion medium is removed from the dispersion of the sol-gel silica particles or the surface-treated sol-gel silica particles. The sol-gel silica or the surface-treated sol-gel silica can thus be directly obtained. In this case, when the dispersion medium is removed by heating, a salt derived form a specific coagulating agent disappears, which reduces the coagulation effect. Accordingly, in this case, the specific coagulating agent is added as appropriate to the concentrate of the dispersion of the sol-gel silica particles or the surface-treated sol-gel silica particles during concentration and drying so that the salt will not disappear in the concentrate.

In the present embodiment, the sol-gel silica or surface-treated sol-gel silica obtained by the above method is dry powder in the form of loose aggregates of individual particles. Such sol-gel silica or surface-treated sol-gel silica does not contain agglomerates that are hard to crush, is easily crushable and have high dispersibility. For example, by shearing of a dispersing machine for dispersing sol-gel silica particles in a resin or solvent, the sol-gel silica or the surface-treated sol-gel silica can be easily crushed without performing any special crushing process and can be uniformly dispersed in the resin or solvent. When preparing a sample for particle size measurement of the silica particles by the Coulter counter method, sol-gel silica or surface-treated sol-gel silica is easily crushed when a dispersion process is performed by emitting ultrasonic waves to a dispersion of 5 mass % of sol-gel silica or surface-treated sol-gel silica in ethanol at 40 W for about 10 minutes.

(6) Baking Step

In the production method (I), of the sol-gel silica obtained by drying, the sol-gel silica surface-treated in the dispersion silica particle surface treatment step (2) may be used as it is in various applications such as fillers for semiconductor encapsulants, sealants for liquid crystal, and films. In this surface-treated sol-gel silica, however, the dispersion medium absorbed by the particles has not been completely removed. Moreover, this surface-treated sol-gel silica has silanol groups remaining therein and has pores. Accordingly, depending on the application, it is preferable that the sol-gel silica or surface-treated sol-gel silica obtained in the solid-liquid separation/drying step (5) be further subjected to the baking step followed by the surface treatment again in order to remove the dispersion medium from the particles to a large extent and crush the silanol groups to obtain solid sol-gel silica (the production method (II)).

That is, the sol-gel silica subjected to the baking step is preferable not only because it has reduced silanol group content but also because the dispersion medium remaining in the particles has been removed. In the case where sol-gel silica with a solvent remaining in its particles is used as a filler for resin, the solvent remaining in the particles generates air bubbles etc. when heated, which causes reduction in yield. This is especially significant in the case where such sol-gel silica is used in applications for semiconductor encapsulants or applications for sealants for liquid crystal in which the filling ratio is high. It is therefore preferable that the production method include the baking step especially when producing surface-treated sol-gel silica to be used in applications for semiconductor encapsulants or applications for sealants for liquid crystal.

When the surface-treated sol-gel silica of the present embodiment is heated at 700° C. for 5 hours, its heating loss is 0.1 to 20%. In the sol-gel silica subjected to the baking step, however, the dispersion medium remaining in the particles has been removed and the sol-gel silica has been sintered. Accordingly, the heating loss of the sol-gel silica subjected to the baking step is usually 5% or less, and particularly preferably 3% or less.

When the baking temperature for the baking step is too low, it is difficult to remove the dispersion medium component. When the baking temperature is too high, the silica particles will be fused together. The baking temperature is therefore preferably 300 to 1300° C., and more preferably 600 to 1200° C.

The baking time is not particularly limited as long as the dispersion medium remaining in the particles is removed. However, a too long baking time reduces productivity. Accordingly, it is preferable that the baking time after heating the sol-gel silica to an intended baking temperature be 0.5 to 48 hours. More preferably, after the sol-gel silica is heated to an intended baking temperature, the sol-gel silica is held at this temperature for 2 to 24 hours for baking.

The atmosphere during baking is also not particularly limited. The baking step can be performed in an inert gas atmosphere such as argon or nitrogen or in the atmosphere.

The sol-gel silica resulting from the baking step is also dry powder in the form of loose aggregates of individual particles as described above.

Aggregates in the dry powder resulting from the baking can further be reduced by crushing the dry powder by known crushing means. Examples of the known crushing include a ball mill and a jet mill.

(7) Baked Silica Particle Surface Treatment Step

The surfaces of the sol-gel silica particles resulting from the baking step are treated using a surface treatment agent. The surface treatment in the dispersion silica particle surface treatment step (2) is wet surface treatment because this surface treatment is for the sol-gel silica in the dispersion produced by the sol-gel silica dispersion production step (1). However, the surface treatment in the step (7) is dry surface treatment. Accordingly, the surface treatment in the step (7) can be efficiently performed using various surface treatment agents.

However, the dry surface treatment causes more crosslinking of the surface treatment agent than the wet surface treatment, and therefore formation of strong agglomerates is more significant in the dry surface treatment than in the wet surface treatment. Especially if the coarse independent primary particles and strong agglomerates formed in the sol-gel silica dispersion production step (1) and the dispersion silica particle surface treatment step (2) have not been removed in the surface-treated sol-gel silica dispersion wet filtration step (3), more strong agglomerates will form from these coarse particles in the surface treatment of the baked silica particles. As a result, in the wet filtration following the surface treatment of the baked silica particles, sieves with small openings would be clogged, making it industrially difficult to perform this wet filtration.

<Surface Treatment Agent and Amount Thereof>

This surface treatment agent is preferably any of the surface treatment agents shown in the dispersion silica particle surface treatment step (2). That is, the surface treatment agent is preferably at least one selected from the group consisting of silicone oil, silane coupling agents, siloxanes, and silazanes.

As described above, the surface treatment of the baked silica particles is dry surface treatment. It is therefore easy to use a resin as the surface treatment agent. The coating resin is not particularly limited and is preferably a polymer having an epoxy group or a (meth)acrylic group as described above.

In the case where the polymer having an epoxy group is used as the coating resin, a polymerizable composition containing a radical polymerizable monomer having an epoxy group is used so that the amount of epoxy group-containing radical polymerizable monomer is preferably 0.01 to 5 parts by mass, and particularly preferably 0.1 to 1 part by mass, per 100 parts by mass of the sol-gel silica. In the case where a crosslinking agent is used, the molar ratio of the crosslinking agent to the epoxy group-containing radial polymerizable monomer is preferably in the range of 0.01 to 1, and particularly preferably in the range of 0.01 to 0.3. Additives such as other radical polymerizable monomer, a polymerization initiator, a polymerization inhibitor, a polymerization retarder, and an ultraviolet absorber may be added as necessary to the polymerizable composition containing a radical polymerizable monomer having an epoxy group.

In the above additives, other radical polymerizable monomer is added in order to facilitate absorption or adhesion of the epoxy group-containing radical polymerizable monomer by raw material powder, in order to dissolve the epoxy-group containing radial polymerizable monomer in the case where the epoxy-group containing radial polymerizable monomer is solid at normal temperature and pressure, or in order to improve physical properties of the coating resin. Suitable examples of other radical polymerizable monomer include aromatic vinyl monomers such as styrene, α-methyl styrene, vinyl toluene, 2,4-dimethylstyrene, p-tert-butylstyrene, chloromethylstyrene, p-chlorostyrene, and vinylnaphthalene, (meth)acrylic monomers such as methyl (meth)acrylate, ethyl (meth)acrylate, butyl (meth)acrylate, 2-ethylhexyl (meth)acrylate, lauryl (meth)acrylate, tridodecyl (meth)acrylate, benzyl (meth)acrylate, phenoxyethyl (meth)acrylate, 2-methoxyethyl (meth)acrylate, 2-ethoxyethyl (meth)acrylate, 2-hydroxyethyl (meth)acrylate, diacetone methacrylamide, (meth)acrylonitrile, (meth)acrolein, trifluoromethyl(meth)acrylate, pentafluoroethyl (meth)acrylate, perfluorobutyl (meth)acrylate, perfluoro-2-ethylhexyl (meth)acrylate, and perfluorooctylethyl (meth)acrylate, vinyl acetate, methyl vinyl ketone, vinyl pyrrolidone, ethyl vinyl ether, divinyl sulfone, and diallyl phthalate.

Such other radical polymerizable monomer is added to the polymerizable composition so that the molar ratio of other radical polymerizable monomer to the epoxy group-containing radical polymerizable monomer is preferably in the range of 0.001 to 1, and particularly preferably in the range of 0.01 to 0.3.

As the polymerization initiator, a known polymerization initiator is selected as appropriate according to the radial polymerizable monomer to be used. In order to prevent ring opening of the epoxy group, it is necessary to a radial polymerization initiator. Among these polymerization initiators, a polymerization initiator that exhibits a polymerization initiation ability when heated is particularly preferable due to its simpler and easier operation. Examples of a suitable polymerization initiator include organic peroxides such as octanoyl peroxide, lauroyl peroxide, t-butylperoxy-2-ethylhexanoate, benzoyl peroxide, t-butylperoxy isobutyrate, t-butylperoxy laurate, t-hexylperoxy benzoate, and di-t-butyl peroxide, and azobis polymerization initiators such as 2,2,-azobisisobutyronitrile, and 2,2,-azobis-(2,4,-dimethylvaleronitrile). In the case where any of these polymerization initiators is used, 0.1 to 20 parts by mass, and preferably 0.5 to 10 parts by mass, of the polymerization initiator is added per 100 parts by mass of the epoxy group-containing radical polymerizable monomer. In the case where other radical polymerization monomer described above is added, it is preferable to increase the amount of polymerization initiator according to the type and amount of other radical polymerization.

Additives such as a polymerization inhibitor, a polymerization retarder, and an ultraviolet absorber may be used as necessary. These additives are not particularly limited and known additives can be used.

In the case where a polymer having an epoxy group is solid or has high viscosity, the polymer having an epoxy group may be used in a liquid state using a small amount of solvent. In this case, the solvent is not particularly limited as long as it neither opens the epoxy ring nor affects polymerization. Specifically, the solvent is preferably an organic solvent, and particularly suitably alcohols. Specific examples of the alcohols include methyl alcohol, ethyl alcohol, and 1-propylalcohol.

In the case where a polymer having a (meth)acrylic group is used as the coating resin, a polymerizable composition containing a (meth)acrylic group/epoxy group-containing monomer is used so that the amount of (meth)acrylic group/epoxy group-containing monomer is preferably 0.01 to 5 parts by mass, and particularly preferably 0.1 to 5 part by mass, per 100 parts by mass of the sol-gel silica.

In the case where a crosslinking agent is used, the molar ratio of the crosslinking agent to the epoxy group-containing radial polymerizable monomer is preferably in the range of 0.01 to 1, and particularly preferably in the range of 0.01 to 0.3.

In the case where a polyaddition reaction of the (meth)acrylic group/epoxy group-containing monomer is caused in the presence of an epoxy curing agent, the epoxy curing agent is not particularly limited, and known epoxy curing agents can be suitably used. Examples of the epoxy curing resin include an organic acid dihydrazide compound, imidazole and its derivatives, aromatic amines, and dicyandiamide. These epoxy curing agents may be used alone or in combination of two or more. The amount of epoxy curing agent is determined according to the equivalent of an additional functional group of the epoxy curing agent to be used. The amount of epoxy curing agent is typically 20 to 200 parts by mass, and preferably 40 to 100 parts by mass, per 100 parts by mass of the (meth)acrylic group/epoxy group-containing monomer.

Additives such as an epoxy resin and a curing accelerator may be added as necessary to the polymerizable composition containing a (meth)acrylic group/epoxy group-containing monomer).

As the epoxy resin, known epoxy resins can be used without any particular limitation. Examples of the epoxy resin include bisphenol epoxy resins such as bisphenol A and bisphenol F, cresol novolak epoxy resins, and phenol novolak epoxy resins. These compounds include monomers and oligomers. These epoxy resins may be used alone or in combination of two or more. The amount of epoxy resin is determined according to the epoxy equivalent of the epoxy resin to be used. Typically, the amount of epoxy resin is preferably 10 to 500 parts by mass, and more preferably 50 to 300 parts by mass, per 100 parts by mass of the (meth)acrylic group/epoxy group-containing monomer.

Adding the epoxy resin increases the amount of epoxy groups in the polymer having an (meth)acrylic group and thus increases the amount of portion that is subjected to the polymerization reaction. Accordingly, the polymerization reactivity and the reaction rate are increased. A stronger epoxy polymer can thus be produced.

As the curing accelerator, known curing accelerators can be used without any particular limitation. Examples of the curing accelerator include imidazole curing accelerators such as imidazole and 2-methylimidazole, phosphine derivatives such as triphenylphosphine, tris-p-methoxyphenyl phosphine, and tricyclohexylphosphine, and cycloamidine derivatives such as 1,8-diazabicyclo(5.4.0)undeca-7-ene. In the case where the curing accelerator is added, the amount of curing accelerator is preferably 0.1 to 10 parts by mass, and more preferably 0.5 to 5 parts by mass, per 100 parts by mass of the (meth)acrylic group/epoxy group-containing monomer. Adding the curing accelerator reduces the reaction time and thus improves production efficiency. In the case where the epoxy resin is added to the polymer having a (meth)acrylic group, the amount of curing accelerator to be added is determined according to the epoxy equivalent of the epoxy resin and the amount of epoxy resin to be added. Typically, about 1 to 50 parts by mass of the curing accelerator is added to 100 parts by mass of the epoxy resin.

In the case where the surfaces of the sol-gel silica particles are treated using the coating resin, it is not always necessary to coat the entire surface of the sol-gel silica particle, and a part of the surface of the sol-gel silica particle need only be coated with the coating resin. In view of stability of the coating resin, it is suitable that 50% or more of the surface, more preferably 70% or more of the surface, and most preferably the entire surface, be coated with the coating resin. The coating state is not particularly limited as long as the coating resin has been fixed to the surface of the core particle in such a form that the coating resin will not easily peel off. For example, in the case where the core particle has pores, the coating resin may be present in such a state that the coating resin covers the wall surfaces of the pores, in such a state that the coating resin fills the pores, or in a combined state of these states.

The functional group content of the coating resin is suitably 0.01 to 25 (µmol), and particularly suitably 0.1 to 15 µmol, per square meter of the surface area of the sol-gel silica particles surface-treated with the coating resin.

The proportion of the coating resin is not particularly limited. However, when the proportion of the coating resin is too low, the surface treatment is not sufficiently performed. When the proportion of the coating resin is too high, aggregation occurs. Accordingly, the proportion of the coating resin is preferably 0.05 to 10 parts by mass, and more preferably 0.1 to 2 parts by mass, per 100 parts by mass of the sol-gel silica powder to be used.

The above surface treatment agents may be used alone or in combination of two or more. For example, in the case where the surface treatment is performed using the coating resin, it is preferable to treat the silica surface in advance with silazanes to reduce the silanol group content in the silica surface. This is preferable because stability of the epoxy group or (meth)acrylic group is improved.

Of the above surface treatment agents, at least one selected from the group consisting of silane coupling agents and silazanes is preferably used, and silazanes are more particularly used because the resultant sol-gel silica has high fluidity.

<Surface Treatment Apparatus>

In the present embodiment, the silica surface is treated by dry surface treatment by mixing the sol-gel silica and various surface treatment agents. Means for mixing the sol-gel silica and various surface treatment agents is not particularly limited but is preferably mixing means that does not use a rotating body having a drive unit. Specific examples of the mixing means include mixing by rotation or swinging of a vessel body and air flow mixing using air. Examples of a mixer having such mixing means include a V-blender, a rocking mixer, and a double-cone mixer which mix materials by rotation or swinging of a vessel body, and an air blender that mixes materials using air.

In the case where mixing means using a rotating body having a drive unit is used, the steering energy that is applied to the sol-gel silica when the sol-gel silica hits stirring/mixing blades is usually as high as 50 J, and therefore the particles are likely to be aggregated. Specific examples of such mixing means include mixers having stirring blades, mixing blades, etc., such as Henschel mixers and Loedige mixers.

The mixer used in the present embodiment preferably has at least one crushing blade as mean for making the grain sizes of the sol-gel silica before and after the surface treatment the same. The crushing blade is a rotating body having a rotating shaft, which serves as crushing means. The crushing blade is at least one blade extending perpendicularly to the rotating shaft, and the rotating shaft either passes through the center of gravity of the blade or is located at one end of the blade. In the case where a plurality of crushing blades are attached to the same rotating shaft, the crushing blades may be attached at any positions on the rotating shaft as long as there is sufficient clearance between each crushing blade and the inner wall of a mixing vessel and between each crushing blade and the other crushing blades. The plurality of crushing blades may be attached either at one position or at a plurality of positions. In view of the capacity of the mixer, the amount of sol-gel silica to be treated, and the crushing energy described below, it is preferable that one to four crushing blades be attached to a single rotating shaft. In the present embodiment, the crushing energy of the crushing blades is preferably 0.3 to 10 J. When the crushing energy is less than 0.1 J, aggregated particles remain without being sufficiently crushed. When the crushing energy is higher than 20 J, the sol-gel silica tends to be reaggregated. Since the stirring energy of the stirring/mixing blades used as the mixing means is 50 J or more, the crushing energy is much smaller than the stirring energy of the stirring/mixing blades. Accordingly, the crushing blade of the present embodiment is clearly distinguished from a rotating body having a drive unit, which is used as the mixing means. Namely, the crushing blade of the present invention is clearly distinguished from the stirring/mixing blades.

Examples of a method for calculating the crushing energy will be specifically described. The crushing energy is calculated for each rotating shaft. The moment of inertia of the crushing blade is first obtained.

(In the case where the rotating shaft passes through the center of gravity of the blade)

In the case where the rotating shaft passes through the center of gravity of the blade, the moment of inertia ($Iz_1$) of such a blade is calculated by the following expression (1), where $a_1$(m) represents the length of the longer side of the crushing blade which is perpendicular to the rotating shaft, b(m) represents the length of the shorter side of the crushing blade, t(m) represents the thickness of the crushing blade, M(kg) represents the weight of the crushing blade, and m represents the number of blades attached to the same rotating shaft.

$$Iz_1(\text{kg·m}^2) = (a_1^2 + b^2) \times M/12 \times m \quad (1)$$

(In the case where the rotating shaft is located one end of the blade)

In the case where the rotating shaft is located at one end of the blade, the moment of inertia ($Iz_2$) of such a blade is calculated by the following expression (2), where $a_2$(m) represents the length of the longer side of the crushing blade which is perpendicular to the rotating shaft, b(m) represents the length of the shorter side of the crushing blade, t(m) represents the thickness of the crushing blade, M(kg) represents the weight of the crushing blade, and n represents the number of blades attached to the same rotating shaft.

$$Iz_2(\text{kg·m}^2) = (a_2^2 + b^2 + 12(a_2/2)^2) \times M/12 \times m \quad (2)$$

(In the case where there are both a blade with the rotating shaft passing through its center of gravity and a blade with the rotating shaft located at its one end)

The moment of inertia ($Iz_3$) of the crushing blade is calculated by the following expression (3).

$$Iz_3(\text{kg·m}^2) = Iz_1 + Iz_2 \quad (3)$$

Next, the crushing energy E(J) is calculated by the following expression (4) using the moments of inertia calculated by the expressions (1), (2), and (3) and the rotational speed ω (rad/s) of the crushing blade.

$$\text{Crushing energy } E(J) = Iz \times \omega^2/2 \quad (4)$$

In the case where the mixer has a crushing blade with a shape other than the above shapes, the crushing energy can be calculated by a known expression according to the shape of the crushing blade.

In the mixer of the present embodiment, the crushing energy per rotating shaft need only be in the range described above. The mixer of the present embodiment need only include at least one rotating shaft with a crushing blade. The mixer may have a plurality of rotating shafts. In this case, the crushing energy of the crushing blade of each rotating shaft is in the range of 0.3 to 10 J.

The material of the rotating shaft and the crushing blade is not particularly limited. Specific examples of the material include metals such as stainless steel and aluminum and resins such as polycarbonate, polypropylene, and acryl resin. Among these, metals, especially stainless steel, are preferred due to their high abrasion resistance.

The shape of the crushing blade is not particularly limited, and crushing blades with known shapes can be used. For example, horizontal, L-shaped, and cylindrical crushing blades can be used.

The crushing blade is small enough to be accommodated in the mixer. The size of the crushing blade is not particularly limited as long as the crushing energy is within the range described above. During rotation of the crushing blade, the crushing blade may be locally subjected to load from the material contained in the mixer. Even in this case, the crushing blade need only be attached with sufficient clearance to the wall surface or the other crushing blades so that the crushing blade will not hit the wall surface or the other crushing blades.

When the length of the longer side of the crushing blade is too short, the crushing blade has a reduced crushing effect (the crushing blade need to rotate at higher speeds in order to achieve required crushing energy). When the length of the longer side of the crushing blade is too long, large power is required to rotate the crushing blade. The longer the length of the longer side of the crushing blade is, the more the sol-gel silica tends to be reaggregated as the crushing energy becomes higher than the range described above. Accordingly, the length of the longer side of the crushing blade is preferably 300 mm or less.

The thickness of the crushing blade is not particularly limited but is preferably 1 to 5 mm.

The rotational speed of the crushing blade also directly relates to the crushing energy, as shown by the above expression. The rotational speed of the crushing blade is preferably 50 to 300 (rad/s), although it depends on the size of the crushing blade. When the rotational speed of the crushing blade is too low, the crushing blade has a reduced crushing effect. When the rotational speed of the crushing blade is higher than 310 (rad/s), the crushing energy tends to be larger than 10 J. Setting the rotational speed of the crushing blades to small values also tends to reduce mechanical load.

Accordingly, each of the length of the longer side, the length of the short side, and the thickness of the crushing blade, the number of crushing blades, and the rotational speed of the crushing blade is selected relatively within the range described above in view of the material of the crushing blade, namely the weight of the crushing blade, so that the crushing energy per rotating shaft as calculated by the expressions (1) to (4) is 0.3 to 10 J.

The position where the rotating shaft of the crushing blade is attached is not particularly limited as long as the crushing blade is located in a powder contact portion in the mixer. For example, in the case where a V-blender, a rocking mixer, or a double-cone mixer is used, the crushing blade can contact power wherever the crushing blade is attached in the space of the mixer. Accordingly, the crushing blade can be attached at any position on the inner side surface of a body of the mixer or on the inner wall surfaces of both ends of the mixer. In the case where an air blender is used, the crushing blade need only be attached so that the crushing blade efficiently contacts powder in view of the flow of the sol-gel silica which is caused by air flow. In this case, the crushing blade can be attached at any position on the inner side surface of a body of the air blender and on the inner wall surface of a ceiling part of the air blender.

The size of the mixer that is used to mix the sol-gel silica and various surface treatment agents is not particularly limited but a mixer with a capacity of 10 L to 4 m³ is suitably used.

<Surface Treatment>

How to perform dry surface treatment using the surface treatment apparatus will be described.

First, the sol-gel silica is fed to the surface treatment apparatus. The amount of sol-gel silica to be fed to the surface treatment apparatus is not particularly limited as long as the surface treatment apparatus can mix the sol-gel silica fed thereto. In view of typical treatment efficiency, the amount of sol-gel silica to be fed to the mixer is preferably 10 to 60% of the capacity of the mixer, and more preferably 30 to 50% of the capacity of the mixer.

Next, the surface treatment agent and/or the coating resin is fed to the mixer to which the so-gel silica has been fed. The amount of surface treatment agent to be fed to the mixer is as described above.

The surface treatment agent may be mixed with the sol-gel silica after being diluted with a solvent. The solvent is not particularly limited as long as the surface treatment agent is dissolved therein. The solvent is also not particularly limited as long as it does not affect the functional group of the surface treatment agent, and known solvents can be used. Specifically, an organic solvent is preferable, and especially alcohols are suitably used. Specific examples of alcohols include methyl alcohol, ethyl alcohol, and 1-propylalcohol. The dilution rate for the solvent is not particularly limited, but the surface treatment agent is typically diluted by a factor of about 2 to 5.

The surface treatment agent is preferably fed by dropping or spraying using a pump etc. Known spray nozzles etc. can be suitably used for the spraying.

The surface treatment agent may be fed at a time, may be fed while being mixed with the sol-gel silica, or may be fed continuously or intermittently. Especially in the case where a large amount of sol-gel silica is to be surface-treated, it is preferable that the surface treatment agent be fed continuously or intermittently while being mixed with the sol-gel silica.

In the case where the surface treatment agent is fed continuously or intermittently, the feed rate of the surface treatment agent is not particularly limited but is determined in view of the amount of surface treatment agent to be fed etc. It is typically preferable to feed the surface treatment agent at 1/20 ml/min per 100 g of sol-gel silica powder. Especially in the case where a large amount of surface treatment agent is to be fed, feeding the surface treatment agent at a low rate increasing the treatment time and thus reduces productivity. In the case where the surface treatment agent is fed at a time or at an excessively high rate, the surface treatment agent is fed in larger droplets, and aggregated particles tends to be formed in the sol-gel silica.

The atmosphere in the mixer is not particularly limited, but inert gases such as nitrogen, helium, and argon are preferably used. This restrains hydrolysis by water and oxidative degradation by oxygen.

The temperature conditions for feeding the surface treatment agent and mixing the surface treatment agent with the sol-gel silica are not particularly limited. However, when the temperature is too high, polymerization of the surface treatment temperature occurs and the surface treatment agent is rapidly vaporized. Accordingly, the temperature is typically about −10 to 40° C.

The mixing need only be performed so that the surface treatment agent is uniformly mixed with the sol-gel silica. The mixing time is determined as appropriate according to the amount of sol-gel silica to be surface-treated and the capability of the mixer. For example, in the case where 80 kg of sol-gel silica powder is surface-treated using a double-cone mixer having a capacity of 340 L, the surface treatment agent is sufficiently mixed with the sol-gel silica powder within 3 hours.

When mixing the sol-gel silica and the surface treatment agent, aggregated particles are usually formed due to uneven distribution of the surface treatment agent or strong mixing energy. However, in the case where the mixing means that does not use a rotating body having a drive unit, formation of such aggregated particles in the sol-gel silica is restrained. Moreover, since the crushing blade is attached inside the mixer, the aggregated particles formed are efficiently crushed by the crushing blade before changing into strongly aggregated particles. A mixture of the sol-gel silica and the surface treatment agent with a significantly reduced amount of aggregated particles is obtained. In the case where such a mixer is used, the particle surfaces are uniformly treated with the surface treatment agent even when an excessive amount of surface treatment agent is fed to the mixer. Accordingly, surface-treated sol-gel silica with a reduced amount of aggregated particles is obtained.

Subsequently, the mixture of the sol-gel silica and the surface treatment agent with a reduced amount of aggregated particles is subjected to heat treatment to coat the sol-gel silica surface with the surface treatment agent. In the case where a mixer having heating means is used, the sol-gel silica and the surface treatment agent may be heated while being mixed together. Alternatively, the sol-gel silica sufficiently mixed with the surface treatment agent may be taken out and heated in a separate heater. Namely, the heat treatment may be performed without mixing means.

In the latter case, the atmosphere gas in the separate heater is not particularly limited, but the inert gas atmosphere such as nitrogen, helium, and argon is preferred as in the case of the mixer.

When the temperature for the heat treatment is too low, the reaction proceeds slowly and thus production efficiency is reduced. When the temperature for the heat treatment is too high, it facilitates decomposition of the surface treatment agent and aggregation due to a rapid polymerization reaction. Accordingly, the heat treatment is typically performed at 40 to 300° C., and preferably 80 to 250° C., although it depends on the surface treatment agent to be used. When the temperature conditions are in this range, the vapor pressure of the surface treatment agent in the mixer is preferably 1 kPa or more. It is more preferable to perform the heat treatment at such a temperature that the surface treatment agent has a vapor pressure of 10 kPa or higher. In the surface treatment of the sol-gel silica, the pressure in the mixer may be any of a normal pressure, an increased pressure, and a negative pressure.

The heat treatment time is determined as appropriate according to the reactivity of the surface treatment agent to be used. Usually, a sufficient reaction rate can be achieved within 24 hours.

(8) Baked Silica Wet-Filtration/Solid-Liquid Separation/Drying Step

The surface-treated sol-gel silica obtained by the baked silica surface treatment step contains particles adhering to each other, agglomerates, etc. The particles adhering to each other, the agglomerates, etc. are therefore removed by wet filtration. Specifically, the surface-treated sol-gel silica is dispersed in a solvent, and the dispersion is filtered by wet filtration to remove coarse particles. The coarse particles together with a surface treatment reaction residue etc. are thus separated on the filter medium, and the dispersion having the coarse particles removed therefrom is recovered as filtrate.

As the solvent that is used to produce the dispersion of the surface treated sol-gel silica, known solvents that do not affect the modifying group of the surface-treated sol-gel silica surface can be used. Specific examples of the solvent include water and alcohols. In the case where the surface-treated sol-gel silica exhibits hydrophobicity, alcohols can be suitably used as the solvent.

When the proportion of the surface-treated sol-gel silica particles in the dispersion of the surface-treated sol-gel silica particles is too high, the dispersion has high viscosity and is therefore difficult to handle. When the proportion of the surface-treated sol-gel silica particles in the dispersion is too low, the amount of surface-treated sol-gel silica particles that can be obtained per batch is small, which is economically disadvantageous. In view of these, the concentration of silica particles in the resultant dispersion of the surface-treated sol-gel silica particles is preferably 1 to 60 mass %, and particularly preferably 25 to 50 mass %. In the case where the proportion of the surface-treated sol-gel silica particles in the dispersion is too high and the dispersion is difficult to handle, it is preferable to add the solvent before the subsequent dispersion filtration step to adjust the concentration.

When the dispersion of the surface-treated baked silica particles is thus obtained, wet filtration is performed using this dispersion in a manner similar to that of the "surface-treated sol-gel silica dispersion wet filtration step (3)." The surface-treated sol-gel silica is then separated from the resultant filtrate by sold-liquid separation and dried. This solid-liquid separation and the drying are performed in a manner similar to that described in the "solid-liquid separation/drying step (5)."

EXAMPLES

Examples of the present embodiment will be specifically described. However, the present invention is not limited in any way by these examples.

Physical properties used to evaluate the examples and comparative examples were evaluated as follows.

(Average particle size, coefficient of variation, and 5 μm or larger coarse particle count in laser diffraction scattering)

About 0.1 g of sol-gel silica powder or surface-treated sol-gel silica powder was measured with an electronic balance and placed in a 50 mL glass bottle. About 40 ml of distilled water or ethanol was added, and the sol-gel silica powder or the surface-treated sol-gel silica powder was dispersed in the distilled water or ethanol at 40 W for 10 minutes using an ultrasonic homogenizer (Sonifier 250, made by Branson Ultrasonics). The average particle size (μm) and the coefficient of variation of the surface-treated sol-gel silica powder were measured using a laser diffraction scattering particle analyzer (LS-230, made by Beckman Coulter, Inc.). The average particle size (μm) herein means a 50% particle size in volume-based cumulative particle size distribution.

Whether there was any signal of 5 μm or larger coarse particles or not was checked in laser diffraction scattering.

(5 μm or larger, 3 μm or larger, and 20 μm or larger coarse particle counts in the Coulter counter method)

Five of 50 mL glass bottles were prepared. About 1 g of surface-treated sol-gel silica powder was measured with an electronic balance and placed in each glass bottle. 19 g of ethanol was added to each glass bottle, and the surface-treated sol-gel silica powder was dispersed in the ethanol at 40 W for 10 minutes using an ultrasonic homogenizer (Sonifier 250 made by Branson Ultrasonics). The resultant dispersions were used as measurement samples. The particle sizes of the individual surface-treated sol-gel silica particles were measured using a Coulter counter (Multisizer 3 made by Beckman Coulter, Inc.), with an aperture size of 30 μm for 3 μm and 5 μm particles and with an aperture size of 50 μm for 20 μm particles. About 50 thousands of particles were measured per sample, and therefore about 250 thousands of particles were measured in total. The number of particles with particle sizes of 5 μm or more, the number of particles with particle sizes of 3 μm or more, and the number of particles with particle sizes of 20 μm or more were calculated as coarse particle counts (ppm) relative to the measured total particle count.

(Heating Loss)

Heating loss was obtained using a simultaneous thermogravimetric analyzer (TG-DTA, TG8120 made by Rigaku Corporation). Specifically, about 10 mg of the surface-treated sol-gel silica powder was measured with an electronic balance and placed in a sample holder. The sample was heated to 700° C. at 20° C./min and held at 700° C. for 5 hours. The heating loss was calculated from the difference in weight before and after heating.

(Sphericity)

The shapes of the surface-treated sol-gel silica particles were observed using a SEM (JSM-6060 made by JEOL Ltd.) to obtain their sphericity. Specifically, 1000 or more silica particles were observed, and the sphericity of each particle was measured using an image processing program (AnalySIS made by Soft Imaging System GmbH), and the average sphericity of these particles was obtained. The sphericity was calculated by the following expression.

$$\text{Sphericity} = 4\pi \times (\text{area})/(\text{perimeter})^2$$

(α radiation)

α radiation (c/(cm²·h)) of the surface-treated sol-gel silica powder was measured using a measuring apparatus for low α ray (LACS-400M made by Sumika Chemical Analysis Service, Ltd.). The measurement was made on a sample area of 1000 cm².

(Impurity Content)

The impurity content of the surface-treated sol-gel silica was measured as follows.

U, Th: The surface-treated sol-gel silica powder was dissolved in hydrofluoric-nitric acid (5:1 mixture of hydrofluoric acid and nitric acid) by heating, and impurities were measured using ICP mass spectrometry (Agilent 4500 made by Agilent Technologies, Inc.).

Elements of iron, aluminum, chromium, nickel, sodium, and chlorine were quantified using ICP emission spectroscopy, atomic absorption spectroscopy, and ion chromatography.

Fe, Al, Na, K, Ca, Cr, Ni, Ti: The surface-treated sol-gel silica powder was dissolved in hydrofluoric-nitric acid by heating, and impurities were measured using ICP emission spectrometry (iCAP 6500 DUO made by Thermo Fisher Scientific Inc).

$Cl^-$: The surface-treated sol-gel silica powder was mixed with ultrapure water and heat-treated at 100° C. under pressure. The $Cl^-$ concentration (ppm) of the resultant solution was measured using ion chromatography (ICS-2100 made by Nippon Dionex K.K.)

(Measurement of Specific Surface Area)

The specific surface area ($m^2/g$) was measured from nitrogen adsorption by a single point BET method using a specific surface area measuring apparatus SA-100 made by SHIBATA SCIENTIFIC TECHNOLOGY LTD.

(Surface Silanol Group Content)

The sol-gel silica powder before surface treatment to be performed after baking was let stand in an atmosphere of 80% relative humidity for 45 days, and the sample was then dried at 120° C. for 12 hours. The sample thus dried was dispersed in a methanol solvent, and the moisture content of the sample was measured using made a Karl Fisher moisture titrator MKS-210 made by KYOTO ELECTRONICS MANUFACTURING CO., LTD. A titrant used was "HYDRANAL COMPOSITE 5K" (made by Riedel-de-Haen).

The surface silanol group content was calculated from the moisture content measured by the method described above and the specific surface area by using the following expression.

The surface silanol group content(number/$(nm)^2$)= (668.9×moisture content (mass %))/specific surface area($m^2/g$)

(Surface Carbon Content)

The surface carbon content (mass %) of the surface-treated sol-gel silica was measured by a combustion oxidation method (EMIA-511 made by Horiba Ltd.). Specifically, the surface-treated sol-gel silica sample was heated to 1350° C. in an oxygen atmosphere, and the resultant carbon content of the sample was converted to the carbon content per gram of the sample. The surface-treated sol-gel silica used for the measurement was heated at 80° C. as a pretreatment, and the system was decompressed to remove moisture etc. adsorbed in air from the surface-treated sol-gel silica. The carbon content of the surface-treated sol-gel silica was then measured. The carbon content of the surface-treated sol-gel silica was obtained by subtracting the carbon content of non-surface-treated sol-gel silica measured in a similar manner from the measured carbon content of the surface-treated sol-gel silica.

(Surface Polymerizable Group Content)

In the case where the surfaces of the silica particles were treated with a surface treatment agent selected from the group consisting of silicone oil having a polymerizable group, silane coupling agents, siloxanes, and silazanes, the surface polymerizable group content was calculated by the following expression using the surface carbon content.

Surface polymerizable group content($\mu mol/m^2$)=surface carbon content/100/(12×n)/(specific surface area)×(number of polymerizable groups in a molecule of the surface treatment agent)

where n represent the number of carbons in a molecule of the surface treatment agent (carbons included in a hydrolyzable group (methoxy group) are excluded). In the case of silicone having a polymerizable group, an average number of polymerizable groups in a molecule of the surface treatment agent was used, and the number of carbon atoms in a molecule of the surface treating agent was obtained based on the average molecular weight.

In the case where the surface polymerizable group is derived from a polymer having an epoxy group, the epoxy group content ($\mu mol/m^2$) was calculated by measuring the epoxy group content ($\mu mol/g$) per unit mass of the surface-treated sol-gel silica according to JIS-K-7236 (determination of epoxy equivalent in epoxy resins) and then dividing this measured epoxy group content by the specific surface area of the surface-treated sol-gel silica.

In the case where the surface polymerizable group is derived from a polymer having a (meth)acrylic group, the (meth)acrylic group content ($\mu mol/m^2$) was calculated by first measuring the C=C bond content in the (meth)acrylic group to obtain the (meth)acrylic group content ($\mu mol/g$) per unit mass of the surface-treated sol-gel silica and then dividing the obtained (meth)acrylic group content by the specific surface area of the surface-treated sol-gel silica. Specifically, the (meth)acrylic group content ($\mu mol/m^2$) was calculated as follows.

1 g of sol-gel silica coated with a (meth)acrylic group-containing polymer (hereinafter sometimes referred to as the (meth)acrylic group-containing polymer-coated silica) was measured and placed in a 25 mL sample tube. 3 mL of chloroform and 200 μL to 700 μL of a Wijs reagent (0.1 mol/L of an IC1-acetic acid solution) were added, and the resultant mixture was stirred in the dark for 3 hours using a mixing rotor. Subsequently, 50 μL of a 100 g/L potassium iodide aqueous solution and 4 mL of water were added, and the resultant mixture was shaken well by hand. Lastly, the mixture was titrated in 0.01 mol/L of a sodium thiosulfate aqueous solution. The (meth)acrylate group content in 1 g of the (meth)acrylic group-containing polymer-coated silica was thus obtained.

In order to obtain iodine contained in the Wijs reagent, a blank test was similarly performed without using the (meth)acrylic group-containing polymer-coated silica.

The (meth)acrylic group content per unit mass of the (meth)acrylic group-containing polymer-coated silica was obtained as follows.

$A=(B-C)\times D\times 10^{-3}/2$

A: the (meth) acrylic group content per gram of the (meth)acrylic group-containing polymer-coated silica (mol/g)

B: the amount of sodium thiosulfate solution used for the blank test (mL)

C: the amount of sodium thiosulphate solution used for the titration (mL)

D: the concentration of sodium thiosulfate (0.01 mol/L)

(Method for Preparing a Resin Composition for Viscosity Measurement)

10 g of the surface-treated sol-gel silica powder was added to 40 g of a bisphenol A and F type epoxy resin (ZX-1059 made by NIPPON STEEL & SUMIKIN CHEMICAL CO. LTD.), and the mixture was kneaded by hand. The hand-kneaded resin composition thus produced was pre-kneaded using a rotation-revolution mixer (Awatori Rentaro AR-500 made by THINKY CORPORATION) (kneading: 1000 rpm, 8 minutes, defoaming: 2000 rpm, 2 minutes). The pre-kneaded resin composition was kneaded using a three-roll mill (BR-150HCV made by AIMEX CO., Ltd., roll diameter ϕ63.5). The kneading was performed five times at room temperature with a roll to roll distance of 20 μm.

(Viscosity)

The initial viscosity ($\eta 1$) and the viscosity after a week ($\eta 2$) of the kneaded resin compound were measured at a rotational speed of $2\ s^{-1}$ using a rheometer (RheoStress made by HAAKE). The resin composition was stored in a 25° C. constant temperature water bath.

(Rate of Change in Viscosity with Time)

The rate of change in viscosity with time was calculated by the following expression using the initial viscosity ($\eta 1$) and the viscosity after a week ($\eta 2$) of the resin composition.

Rate of change in viscosity with time[%]=(($\eta 2/\eta 1$)−1)×100

(Flow Marks)

25 g of the surface-treated sol-gel silica powder was added to 25 g of the bisphenol A and F type epoxy resin (ZX-1059 made by NIPPON STEEL & SUMIKIN CHEMICAL CO. LTD.), and the mixture was kneaded by hand. The hand-kneaded resin composition thus produced was pre-kneaded using a rotation-revolution mixer (Awatori Rentaro AR-500 made by THINKY CORPORATION) (kneading: 1000 rpm, 8 minutes, defoaming: 2000 rpm, 2 minutes). The pre-kneaded resin composition was kneaded using a three-roll mill (BR-150HCV made by AIMEX CO., Ltd., roll diameter $\phi 63.5$). The kneading was performed five times at room temperature with a roll to roll distance of 20 µm.

Two sheets of glass were placed over each other in advance with a 30 µm gap therebetween. A high temperature penetration test was performed on the produced kneaded resin composition with the sheets of glass heated to 100° C. The kneaded resin composition was observed until it reached 20 mm or until it stopped penetrating. Whether there were flow marks or not was evaluated based on the following criteria by visual observation of the appearance.

None: No flow mark was observed
Almost none: Almost no flow mark was observed
Yes: Observed flow marks were significant Example 1-1

<Production Method (I)>
(1) Sol-Gel Silica Dispersion Production Step

A reactor having a Maxblend blade (blade diameter: 345 mm) was used in a jacketed glass-lined reactor (inside diameter: 1200 mm) with a 1000 L capacity. 75 kg of methanol, 30 kg of isopropanol, 25 kg (25 mass %) of aqueous ammonia were placed as a reaction medium into the reactor (the amount of reaction medium: 150 L). The reaction temperature was set to 40° C., and the mixture was stirred at 52 rpm. A mixture of 3.0 kg of tetraethoxysilanem, 7.0 kg of methanol, and 2.0 kg of isopropanol was then added as a raw material to the reaction medium to produce silica seed particles. Thereafter, 350 kg of tetramethoxysilane and 100 kg of methanol was added as a raw material to the reaction medium at a linear velocity of discharge flow of 51 m/s, and at the same time, 150 kg (25 mass %) of aqueous ammonia was also added to the reaction medium at 0.8 kg/min to grow and synthetize sol-gel silica particles. The dimensionless mixing time nθm was 78.

(2) Dispersion Silica Particle Surface Treatment Step

Stirring was continued for one hour after the addition of the raw material was finished. Thereafter, 4450 g (200 µmol/g for the theoretical amount of synthesized silica) of hexamethyldisilazane (SZ-31 made by Shin-Etsu Silicones, hereinafter referred to as HMDS) was added as a surface treatment agent to the sol-gel particle dispersion. Stirring was continued for 2 hours after the addition of HMDS was finished, whereby surface treatment was performed.

(3) Sol-Gel Silica Dispersion Wet Filtration Step

After 2 hours, the resultant dispersion was passed through a polypropylene filter with a pore size of 3 µm to remove coarse particles. Thereafter, 3 kg of dry ice was added to the dispersion, and the resultant dispersion was then let stand for 20 hours.

(4) Coagulation Step

When 20 hours passed, the sol-gel silica particles had been settled. Solid-liquid separation was performed using quantitative filter paper (retaining particle size: 5 µm). As a result, 190 kg (silica concentration: 74 mass %) of a concentrate was obtained. The filtrate was transparent, no filtrate leakage was observed.

(5) Solid-Liquid Separation/Drying Step

The sol-gel silica concentrate thus obtained was dried at 100° C. under reduced pressure for 15 hours. As a result, 132 kg of surface-treated sol-gel silica particle was obtained.

The surface-treated sol-gel silica powder thus obtained had an average particle size of 0.8 µm, a coefficient of variation of 26%, and a sphericity 0.96. No coarse particles with particle sizes of 5 µm or more were detected in laser diffraction scattering. The 5 µm or larger coarse particle count and the 3 µm or larger coarse particle count of the surface-treated sol-gel silica powder as measured by the Coulter counter method were less than 4 ppm, and 8 ppm, respectively. In a wet sieving process using a test sieve with 20 µm openings, the amount of residue on the sieve was less than 4 ppm. Heating loss was 17%, and the surface carbon content was 0.09 mass %. The initial epoxy viscosity ($\eta 1$) of the surface-treated sol-gel silica was 3.7 Pa·s, and the epoxy viscosity after a week ($\eta 2$) was 3.9 Pa·s. The rate of change in viscosity with time was therefore 5%. No flow mark was observed. The $\alpha$ radiation of the surface-treated sol-gel silica powder was 0.002 c/(cm²·h), and the impurity content was as follows. U: 0.01 ppb, Th: 0.01 ppb, Fe: 0.1 ppm, Al: 0.1 ppm, Na: 0.2 ppm, K: 0.1 ppm, Ca: 0.1 ppm, Cr: 0.0 ppm, Ni: 0.0 ppm, Ti: 0.0 ppm, and Cl⁻: 0.1 ppm.

The treatment conditions for the dispersion silica particle surface treatment step (2) of this example are shown in Table 1. Various measurements were performed according to the above methods using the obtained surface-treated silica. The measurement results of the $\alpha$ radiation and the impurity content are shown in Table 2, and the measurement results of other physical properties are shown in Table 3.

Example 1-2

<Production Method (I)>
2720 g (100 µmol/g for the theoretical amount of synthesized silica) of phenyltrimethoxysilane (KBM-103 made by Shin-Etsu Silicones, hereinafter referred to as PhTS) was added as a surface treatment agent to the sol-gel particle dispersion, instead of the surface treatment agent used in the step (2) of Example 1-1. The steps (1) to (5) were otherwise performed in a manner similar to that of Example 1-1.

The surface-treated sol-gel silica powder thus obtained had an average particle size of 0.8 µm, a coefficient of variation of 24%, and a sphericity 0.96. No coarse particles with particle sizes of 5 µm or more were detected in laser diffraction scattering. Both the 5 µm or larger coarse particle count and the 3 µm or larger coarse particle count of the surface-treated sol-gel silica powder as measured by the Coulter counter method were smaller than 4 ppm. In the wet sieving process using a test sieve with 20 µm openings, the amount of residue on the sieve was less than 4 ppm. Heating loss was 19%, and the surface carbon content was 0.47 mass %. The initial epoxy viscosity ($\eta 1$) of the surface-treated sol-gel silica was 3.1 Pa·s, and the epoxy viscosity after a week ($\eta 2$) was 3.2 Pa·s. The rate of change in viscosity with time was therefore 5%. No flow mark was observed. The $\alpha$ radiation of the surface-treated sol-gel silica powder was 0.002 c/(cm²·h), and the impurity content was as follows. U: 0.02 ppb, Th: 0.01 ppb, Fe: 0.1 ppm, Al: 0.1 ppm, Na: 0.1 ppm, K: 0.1 ppm, Ca: 0.1 ppm, Cr: 0.0 ppm, Ni: 0.0 ppm, Ti: 0.0 ppm, and Cl⁻: 0.1 ppm.

The treatment conditions for the dispersion silica particle surface treatment step (2) of this example are shown in Table 1. Various measurements were performed according to the above methods using the obtained surface-treated silica. The measurement results of the $\alpha$ radiation and the impurity content are shown in Table 2, and the measurement results of other physical properties are shown in Table 3.

Example 1-3

<Production Method (I)>

970 g (30 μmol/g for the theoretical amount of synthesized silica) of acryloyloxypropyltrimethoxysilane (KBM-5103 made by Shin-Etsu Silicones, hereinafter referred to as AcPS) was added as a surface treatment agent to the sol-gel particle dispersion, instead of the surface treatment agent used in the step (2) of Example 1-1. The steps (1) to (5) were otherwise performed in a manner similar to that of Example 1-1.

The surface-treated sol-gel silica powder thus obtained had an average particle size of 0.8 μm, a coefficient of variation of 27%, and a sphericity 0.95. No coarse particles with particle sizes of 5 μm or more were detected in laser diffraction scattering. The 5 μm or larger coarse particle count and the 3 μm or larger coarse particle count of the surface-treated sol-gel silica powder as measured by the Coulter counter method were less than 4 ppm, and 8 ppm, respectively. In the wet sieving process using a test sieve with 20 μm openings, the amount of residue on the sieve was less than 4 ppm. Heating loss was 17%. The surface carbon content was 0.17 mass %, and the surface polymerizable group content calculated from the surface carbon content was 6 μmol/g. The initial epoxy viscosity ($\eta 1$) of the surface-treated sol-gel silica was 4.2 Pa·s, and the epoxy viscosity after a week ($\eta 2$) was 4.4 Pa·s. The rate of change in viscosity with time was therefore 5%. No flow mark was observed. The $\alpha$ radiation of the surface-treated sol-gel silica powder was 0.002 c/(cm²·h), and the impurity content was as follows. U: 0.01 ppb, Th: 0.01 ppb, Fe: 0.1 ppm, Al: 0.0 ppm, Na: 0.2 ppm, K: 0.1 ppm, Ca: 0.1 ppm, Cr: 0.0 ppm, Ni: 0.0 ppm, Ti: 0.0 ppm, and Cl⁻: 0.1 ppm.

The treatment conditions for the dispersion silica particle surface treatment step (2) of this example are shown in Table 1. Various measurements were performed according to the above methods using the obtained surface-treated silica. The measurement results of the $\alpha$ radiation and the impurity content are shown in Table 2, and the measurement results of other physical properties are shown in Table 3.

Comparative Example 1-1

<Production Method (I)>

The wet filtration of the dispersion in the step (3) of Examples 1-1 was not performed. The steps (1) to (5) are otherwise performed in a manner similar to that of Example 1-1.

The surface-treated sol-gel silica powder thus obtained had an average particle size of 0.8 μm, a coefficient of variation of 29%, and a sphericity 0.95. No coarse particles with particle sizes of 5 μm or more were detected in laser diffraction scattering. The 5 μm or larger coarse particle count and the 3 μm or larger coarse particle count of the surface-treated sol-gel silica powder as measured by the Coulter counter method were 180 ppm and 25400 ppm, respectively. In the wet sieving process using a test sieve with 20 μm openings, the amount of residue on the sieve was 10 ppm. Heating loss was 18%, and the surface carbon content was 0.09 mass %. The initial epoxy viscosity ($\eta 1$) of the surface-treated sol-gel silica was 3.9 Pa·s, and the epoxy viscosity after a week ($\eta 2$) was 4.8 Pa·s. The rate of change in viscosity with time was therefore 23%. Flow marks were observed. The $\alpha$ radiation of the surface-treated sol-gel silica powder was 0.002 c/(cm²·h), and the impurity content was as follows. U: 0.01 ppb, Th: 0.01 ppb, Fe: 0.1 ppm, Al: 0.1 ppm, Na: 0.2 ppm, K: 0.1 ppm, Ca: 0.0 ppm, Cr: 0.0 ppm, Ni: 0.0 ppm, Ti: 0.0 ppm, and Cl⁻: 0.1 ppm.

The treatment conditions for the dispersion silica particle surface treatment step (2) of this comparative example are shown in Table 1. Various measurements were performed according to the above methods using the obtained surface-treated silica. The measurement results of the $\alpha$ radiation and the impurity content are shown in Table 2, and the measurement results of other physical properties are shown in Table 3.

Comparative Example 1-2

<Production Method (I)>

Wet filtration of the dispersion was performed after the sol-gel silica particles were grown and synthesized in the step (1) of Example 1-1. The wet filtration of the filtration in the step (3) of Example 1-1 was not performed. The steps (1) to (5) are otherwise performed in a manner similar to that of Example 1-1.

The surface-treated sol-gel silica powder thus obtained had an average particle size of 0.8 μm, a coefficient of variation of 28%, and a sphericity 0.96. No coarse particles with particle sizes of 5 μm or more were detected in laser diffraction scattering. The 5 μm or larger coarse particle count and the 3 μm or larger coarse particle count of the surface-treated sol-gel silica powder as measured by the Coulter counter method were 40 ppm and 2200 ppm, respectively. In the wet sieving process using a test sieve with 20 μm openings, the amount of residue on the sieve was 4 ppm. Heating loss was 18%, and the surface carbon content was 0.09 mass %. The initial epoxy viscosity ($\eta 1$) of the surface-treated sol-gel silica was 4.0 Pa·s, and the epoxy viscosity after a week ($\eta 2$) was 4.7 Pa·s. The rate of change in viscosity with time was therefore 18%. No flow mark was observed. The $\alpha$ radiation of the surface-treated sol-gel silica powder was 0.002 c/(cm²·h), and the impurity content was as follows. U: 0.01 ppb, Th: 0.01 ppb, Fe: 0.1 ppm, Al: 0.1 ppm, Na: 0.2 ppm, K: 0.1 ppm, Ca: 0.0 ppm, Cr: 0.0 ppm, Ni: 0.0 ppm, Ti: 0.0 ppm, and Cl⁻: 0.1 ppm.

The treatment conditions for the dispersion silica particle surface treatment step (2) of this comparative example are shown in Table 1. Various measurements were performed according to the above methods using the obtained surface-treated silica. The measurement results of the $\alpha$ radiation and the impurity content are shown in Table 2, and the measurement results of other physical properties are shown in Table 3.

TABLE 1

Treatment Conditions for Dispersion Silica Particle Surface Treatment Step (2)

| | Type of Surface Treatment Agent | Molecular Weight of Surface Treatment Agent | Amount of Surface Treatment Agent (g) | Amount of Surface Treatment Agent for Theoretical Amount of Synthesized Silica (μmol/g) |
|---|---|---|---|---|
| Example 1-1 | HMDS | 161.4 | 4450 | 200 |
| Example 1-2 | PhTS | 198.3 | 2720 | 100 |
| Example 1-3 | AcPS | 234.3 | 970 | 30 |
| Comparative Example 1-1 | HMDS | 161.4 | 4450 | 200 |
| Comparative Example 1-2 | HMDS | 161.4 | 4450 | 200 |

TABLE 2

α Radiation and Impurity Content of Surfaces-Treated Sol-Gel Silica

| | α Radiation (c/cm²·h) | U (ppb) | Th (ppb) | Fe (ppm) | Al (ppm) | Na (ppm) | K (ppm) | Ca (ppm) | Cr (ppm) | Ni (ppm) | Ti (ppm) | Cl⁻ (ppm) |
|---|---|---|---|---|---|---|---|---|---|---|---|---|
| Example 1-1 | 0.002 | 0.01 | 0.01 | 0.1 | 0.2 | 0.2 | 0.1 | 0.1 | 0.0 | 0.0 | 0.0 | 0.1 |
| Example 1-2 | 0.002 | 0.02 | 0.01 | 0.1 | 0.1 | 0.1 | 0.1 | 0.1 | 0.0 | 0.0 | 0.0 | 0.1 |
| Example 1-3 | 0.002 | 0.01 | 0.01 | 0.1 | 0.0 | 0.2 | 0.1 | 0.1 | 0.0 | 0.0 | 0.0 | 0.1 |
| Comparative Example 1-1 | 0.002 | 0.01 | 0.01 | 0.1 | 0.1 | 0.2 | 0.1 | 0.0 | 0.0 | 0.0 | 0.0 | 0.1 |
| Comparative Example 1-2 | 0.002 | 0.01 | 0.01 | 0.1 | 0.1 | 0.1 | 0.1 | 0.1 | 0.0 | 0.0 | 0.0 | 0.1 |

TABLE 3

Physical Properties of Surface-Treated Sol-Gel Silica

| | Average Particle Size (μm) | Coefficient of Variation (%) | Sphericity (—) | 5μ or larger in laser Diffraction Scattering (—) | Coarse Particle Count in Coulter Counter Method (ppm) ≥5 μm | Coarse Particle Count in Coulter Counter Method (ppm) ≥3 μm | Residue on Sieve with 20 μm Openings (ppm) |
|---|---|---|---|---|---|---|---|
| Example 1-1 | 0.8 | 26 | 0.96 | None Detected | <4 | 8 | <4 |
| Example 1-2 | 0.8 | 24 | 0.96 | None Detected | <4 | <4 | <4 |
| Example 1-3 | 0.8 | 27 | 0.95 | None Detected | <4 | 8 | <4 |
| Comparative Example 1-1 | 0.8 | 29 | 0.95 | None Detected | 180 | 25400 | 10 |
| Comparative Example 1-2 | 0.8 | 28 | 0.96 | None Detected | 40 | 2200 | <4 |

Physical Properties of Surface-Treated Sol-Gel Silica

| | Heating Loss (%) | Surface Carbon Content (mass %) | Surface Polymerizable Group Content (μmol/m²) | Epoxy Viscosity (Pa·s) Initial (η1) | Epoxy Viscosity (Pa·s) After a Week (η2) | Rate of Change in Viscosity with time (%) | Flow Marks (—) |
|---|---|---|---|---|---|---|---|
| Example 1-1 | 17 | 0.09 | — | 3.7 | 3.9 | 5 | None |
| Example 1-2 | 19 | 0.47 | — | 3.1 | 3.2 | 3 | None |
| Example 1-3 | 17 | 0.17 | 6 | 4.2 | 4.4 | 5 | None |
| Comparative Example 1-1 | 18 | 0.09 | — | 3.9 | 4.8 | 23 | Yes |
| Comparative Example 1-2 | 18 | 0.09 | — | 4.0 | 4/7 | 18 | None |

Example 2-1

<Production Method (II)>
(1) Sol-Gel Silica Dispersion Production Step

A reactor having a Maxblend blade (blade diameter: 345 mm) was used in a jacketed glass-lined reactor (inside diameter: 1200 mm) with a 1000 L capacity. 75 kg of methanol, 30 kg of isopropanol, 25 kg (25 mass %) of aqueous ammonia were placed as a reaction medium into the reactor (the amount of reaction medium: 150 L). The reaction temperature was set to 40° C., and the mixture was stirred at 52 rpm. A mixture of 3.0 kg of tetraethoxysilanem, 7.0 kg of methanol, and 2.0 kg of isopropanol was then added as a raw material to the reaction medium to produce silica seed particles. Thereafter, 350 kg of tetramethoxysilane and 100 kg of methanol was added as a raw material to the reaction medium at a linear velocity of discharge flow of 51 m/s, and at the same time, 150 kg (25 mass %) of aqueous ammonia was also added to the reaction medium at 0.8 kg/min to grow and synthetize sol-gel silica particles. The dimensionless mixing time nθm was 78.

(2) Dispersion Silica Particle Surface Treatment Step

Stirring was continued for one hour after the addition of the raw material was finished. Thereafter, 4450 g (200 μmol/g for the theoretical amount of synthesized silica) of hexamethyldisilazane (SZ-31 made by Shin-Etsu Silicones, hereinafter referred to as HMDS) was added as a surface treatment agent to the sol-gel particle dispersion. Stirring was continued for 2 hours after the addition of HMDS was finished, whereby surface treatment was performed.

(3) Sol-Gel Silica Dispersion Wet Filtration Step

After 2 hours, the resultant dispersion was passed through a polypropylene filter with a pore size of 3 μm. The dispersion having coarse particles removed therefrom was thus obtained.

(4) Coagulation Step

After 3 kg of dry ice was added to the dispersion, the resultant dispersion was let stand for 20 hours. When 20 hours passed, the sol-gel silica particles had been settled. Solid-liquid separation was performed using quantitative filter paper (retaining particle size: 5 μm). As a result, 190 kg (silica concentration: 74 mass %) of a concentrate was obtained. The filtrate was transparent, no filtrate leakage was observed.

(5) Solid-Liquid Separation/Drying Step

The sol-gel silica concentrate thus obtained was dried at 100° C. under reduced pressure for 15 hours. As a result, 132 kg of surface-treated sol-gel silica particle was obtained.

(6) Baking Step

The surface-treated sol-gel silica powder obtained in the step (5) was baked at 800° C. for 10 hours in an air atmosphere in a baking furnace to produce baked sol-gel silica powder. The baked sol-gel silica particles did not appear to have been sintered, and 124 kg of baked sol-gel silica particles were obtained. These sol-gel silica particles were crushed at an air pressure of 0.6 MPa, an air flow rate of 2.8 m³/min, and a feed rate of 10 kg/h using a spiral jet mill (STJ-200 made by SEISHIN ENTERPRISE Co., Ltd.).

The baked sol-gel silica powder obtained had an average particle size of 0.7 μm. No coarse particles with particle sizes of 5 μm or more were detected in laser diffraction scattering. The 5 μm or larger coarse particle count and the 3 μm or larger coarse particle count as measured by the Coulter counter method were less than 5 ppm, and 8 ppm, respectively. The specific surface area was 4 m²/g, and the surface silanol group content was 5 μmol/m² (3 silanol groups/nm²).

(7) Baked Silica Particle Surface Treatment Step

Thereafter, surface treatment of the baked sol-gel silica powder was performed.

A double-cone mixer with a capacity of 340 L (W-150 made by TOKUJU Co., LTD) was used as a mixer for surface treatment. This mixer has rotating shafts attached to the inner wall surfaces of the ends, one for each end, and stainless steel crushing blades (200 mm×20 mm×2 mm) attached to the rotating shafts, one for each rotating shaft, at a position 2 cm away from the wall surface such that the rotating shaft passes through the center of gravity of the blade. 80 kg of the sol-gel silica powder was placed into the mixer and the atmosphere in the mixer was replaced with nitrogen. 258 g (20 μmol/g) of HMDS as a surface treatment agent was then dropped using a peristaltic pump. After all of the surface treatment agent was dropped, the mixer was operated at 0.3 rps at room temperature for 3 hours. The rotational speed of the stainless steel crushing blades was set to 157 rad/s (1500 rpm) (crushing energy=2.6 J).

The surface-treated sol-gel silica powder thus mixed was taken out from the mixer and was divided into 10 kg portions. The 10 kg portions were heated at 150° C. for 3 hours in a dryer with the atmosphere replaced with nitrogen.

(8) Baked Silica Wet Filtration/Solid-Liquid Separation/Drying Step

Thereafter, wet filtration of the surface-treated sol-gel silica powder was performed.

15 kg of methanol was placed into a SUS vessel with a capacity of 40 L. 5 kg of the surface-treated sol-gel silica powder was added while being stirred at 100 rpm by a propeller stirrer. The stirring was continued for 60 minutes. A dispersion with a slurry concentration of 25 mass % was thus prepared. The dispersion was then fed at 1 L/min using a diaphragm pump and was passed through a polypropylene filter with a pore size of 3 μm to remove coarse particles from the dispersion. The filtered dispersion was filtered under pressure using filter cloth with permeability of 0.6 cm³/(cm²·s). As a result, 6 kg of the surface-treated sol-gel silica was recovered as a cake.

Subsequently, the cake of the surface-treated sol-gel silica thus recovered was dried under reduced pressure at 120° C. for 24 hours. 4.8 kg of the dried surface-treated sol-gel silica powder was thus obtained.

The surface-treated sol-gel silica powder thus obtained had an average particle size of 0.7 μm, a coefficient of variation of 24%, and a sphericity 0.96. No coarse particles with particle sizes of 5 μm or more were detected in laser diffraction scattering. The 5 μm or larger coarse particle count and the 3 μm or larger coarse particle count of the surface-treated sol-gel silica powder as measured by the Coulter counter method were less than 4 ppm, and 8 ppm, respectively. In a wet sieving process using a test sieve with 20 μm openings, the amount of residue on the sieve was less than 4 ppm. Heating loss was 2%, and the surface carbon content was 0.07 mass %. The initial epoxy viscosity (η1) of the surface-treated sol-gel silica was 3.2 Pa·s, and the epoxy viscosity after a week (η2) was 3.3 Pa·s. The rate of change in viscosity with time was therefore 3%. No flow mark was observed. The α radiation of the surface-treated sol-gel silica powder was 0.002 c/(cm²·h), and the impurity content was as follows. U: 0.02 ppb, Th: 0.02 ppb, Fe: 1.5 ppm, Al: 3.0 ppm, Na: 0.2 ppm, K: 0.1 ppm, Ca: 0.1 ppm, Cr: 0.2 ppm, Ni: 0.2 ppm, Ti: 0.0 ppm, and Cl⁻: 0.1 ppm.

The physical properties of the sol-gel silica obtained by the baking step (6) of this example are shown in Table 4, and the treatment conditions for the baked silica particle surface treatment step (7) of this example are shown in Table 5.

Various measurements were performed according to the above methods using the obtained surface-treated silica. The measurement results of the α radiation and the impurity content are shown in Table 6, and the measurement results of other physical properties are shown in Table 7.

Example 2-2

<Production Method (II)>

375 g (20 µmol/g) of AcPS was dropped using a peristaltic pump, instead of the surface treatment agent used in the step (7) of Example 2-1. The steps (1) to (8) were otherwise performed in a manner similar to that of Example 2-1.

The surface-treated sol-gel silica powder thus obtained had an average particle size of 0.7 µm, a coefficient of variation of 24%, and a sphericity 0.96. No coarse particles with particle sizes of 5 µm or more were detected in laser diffraction scattering. The 5 µm or larger coarse particle count and the 3 µm or larger coarse particle count of the surface-treated sol-gel silica powder as measured by the Coulter counter method were less than 4 ppm, and 8 ppm, respectively. In the wet sieving process using a test sieve with 20 µm openings, the amount of residue on the sieve was less than 4 ppm. Heating loss was 3%. The surface carbon content was 0.14 mass %, and the surface polymerizable group content calculated from the surface carbon content was 19 µmol/g (5 µmol/m²). The initial epoxy viscosity ($\eta 1$) of the surface-treated sol-gel silica was 3.8 Pa·s, and the epoxy viscosity after a week ($\eta 2$) was 4.2 Pa·s. The rate of change in viscosity with time was therefore 11%. No flow mark was observed. The α radiation of the surface-treated sol-gel silica powder was 0.002 c/(cm²·h), and the impurity content was as follows. U: 0.02 ppb, Th: 0.02 ppb, Fe: 1.5 ppm, Al: 3.0 ppm, Na: 0.2 ppm, K: 0.1 ppm, Ca: 0.1 ppm, Cr: 0.1 ppm, Ni: 0.2 ppm, Ti: 0.0 ppm, and Cl⁻: 0.1 ppm.

The physical properties of the sol-gel silica obtained by the baking step (6) of this example are shown in Table 4, and the treatment conditions for the baked silica particle surface treatment step (7) of this example are shown in Table 5. Various measurements were performed according to the above methods using the obtained surface-treated silica. The measurement results of the α radiation and the impurity content are shown in Table 6, and the measurement results of other physical properties are shown in Table 7.

Example 2-3

<Production Method (II)>

750 g (40 µmol/g) of AcPS was dropped using a peristaltic pump, instead of the surface treatment agent used in the step (7) of Example 2-1. The steps (1) to (8) were otherwise performed in a manner similar to that of Example 2-1.

The surface-treated sol-gel silica powder thus obtained had an average particle size of 0.7 µm, a coefficient of variation of 22%, and a sphericity 0.96. No coarse particles with particle sizes of 5 µm or more were detected in laser diffraction scattering. The 5 µm or larger coarse particle count and the 3 µm or larger coarse particle count of the surface-treated sol-gel silica powder as measured by the Coulter counter method were less than 4 ppm, and 8 ppm, respectively. In the wet sieving process using a test sieve with 20 µm openings, the amount of residue on the sieve was less than 4 ppm. Heating loss was 4%. The surface carbon content was 0.28 mass %, and the surface polymerizable group content calculated from the surface carbon content was 39 µmol/g (10 µmol/m²). The initial epoxy viscosity ($\eta 1$) of the surface-treated sol-gel silica was 3.9 Pa·s, and the epoxy viscosity after a week ($\eta 2$) was 4.0 Pa·s. The rate of change in viscosity with time was therefore 3%. No flow mark was observed. The α radiation of the surface-treated sol-gel silica powder was 0.002 c/(cm²·h), and the impurity content was as follows. U: 0.02 ppb, Th: 0.01 ppb, Fe: 1.4 ppm, Al: 2.8 ppm, Na: 0.2 ppm, K: 0.1 ppm, Ca: 0.1 ppm, Cr: 0.2 ppm, Ni: 0.1 ppm, Ti: 0.0 ppm, and Cl⁻: 0.1 ppm.

The physical properties of the sol-gel silica obtained by the baking step (6) of this example are shown in Table 4, and the treatment conditions for the baked silica particle surface treatment step (7) of this example are shown in Table 5. Various measurements were performed according to the above methods using the obtained surface-treated silica. The measurement results of the α radiation and the impurity content are shown in Table 6, and the measurement results of other physical properties are shown in Table 7.

Example 2-4

<Production Method (II)>

378 g (20 µmol/g) of γ-glycidoxypropyltrimethoxysilane (KBM-403 made by Shin-Etsu Silicones, hereinafter referred to as γ-GPS) was dropped using a peristaltic pump, instead of the surface treatment agent used in the step (7) of Example 2-1. The steps (1) to (8) were otherwise performed in a manner similar to that of Example 2-1.

The surface-treated sol-gel silica powder thus obtained had an average particle size of 0.7 µm, a coefficient of variation of 22%, and a sphericity 0.97. No coarse particles with particle sizes of 5 µm or more were detected in laser diffraction scattering. Both the 5 µm or larger coarse particle count and the 3 µm or larger coarse particle count of the surface-treated sol-gel silica powder as measured by the Coulter counter method were less than 4 ppm. In the wet sieving process using a test sieve with 20 µm openings, the amount of residue on the sieve was less than 4 ppm. Heating loss was 3%. The surface carbon content was 0.13 mass %, and the surface polymerizable group content calculated from the surface carbon content was 18 µmol/g (5 µmol/m²). The initial epoxy viscosity ($\eta 1$) of the surface-treated sol-gel silica was 4.3 Pa·s, and the epoxy viscosity after a week ($\eta 2$) was 4.6 Pa·s. The rate of change in viscosity with time was therefore 7%. No flow mark was observed. The α radiation of the surface-treated sol-gel silica powder was 0.002 c/(cm²·h), and the impurity content was as follows. U: 0.01 ppb, Th: 0.02 ppb, Fe: 1.5 ppm, Al: 3.0 ppm, Na: 0.2 ppm, K: 0.1 ppm, Ca: 0.1 ppm, Cr: 0.2 ppm, Ni: 0.2 ppm, Ti: 0.0 ppm, and Cl⁻: 0.1 ppm.

The physical properties of the sol-gel silica obtained by the baking step (6) of this example are shown in Table 4, and the treatment conditions for the baked silica particle surface treatment step (7) of this example are shown in Table 5. Various measurements were performed according to the above methods using the obtained surface-treated silica. The measurement results of the α radiation and the impurity content are shown in Table 6, and the measurement results of other physical properties are shown in Table 7.

Example 2-5

<Production Method (II)>

756 g (40 µmol/g) of γ-GPS was dropped using a peristaltic pump, instead of the surface treatment agent used in the step (7) of Example 2-1. The steps (1) to (8) were otherwise performed in a manner similar to that of Example 2-1.

The surface-treated sol-gel silica powder thus obtained had an average particle size of 0.7 μm, a coefficient of variation of 24%, and a sphericity 0.96. No coarse particles with particle sizes of 5 μm or more were detected in laser diffraction scattering. The 5 μm or larger coarse particle count and the 3 μm or larger coarse particle count of the surface-treated sol-gel silica powder as measured by the Coulter counter method were less than 4 ppm, and 8 ppm, respectively. In the wet sieving process using a test sieve with 20 μm openings, the amount of residue on the sieve was less than 4 ppm. Heating loss was 3%. The surface carbon content was 0.27 mass %, and the surface polymerizable group content calculated from the surface carbon content was 38 μmol/g (9 μmol/m$^2$). The initial epoxy viscosity (η1) of the surface-treated sol-gel silica was 4.5 Pa·s, and the epoxy viscosity after a week (η2) was 4.6 Pa·s. The rate of change in viscosity with time was therefore 2%. No flow mark was observed. The α radiation of the surface-treated sol-gel silica powder was 0.002 c/(cm$^2$·h), and the impurity content was as follows. U: 0.02 ppb, Th: 0.01 ppb, Fe: 1.6 ppm, Al: 3.0 ppm, Na: 0.2 ppm, K: 0.1 ppm, Ca: 0.1 ppm, Cr: 0.2 ppm, Ni: 0.2 ppm, Ti: 0.0 ppm, and Cl$^-$: 0.1 ppm.

The physical properties of the sol-gel silica obtained by the baking step (6) of this example are shown in Table 4, and the treatment conditions for the baked silica particle surface treatment step (7) of this example are shown in Table 5. Various measurements were performed according to the above methods using the obtained surface-treated silica. The measurement results of the α radiation and the impurity content are shown in Table 6, and the measurement results of other physical properties are shown in Table 7.

Example 2-6

<Production Method (II)>

258 g (20 μmol/g) of HMDS was dropped as a surface treatment agent using a peristaltic pump to perform surface treatment as in the step (7) of Example 2-1. Three chemical solutions, specifically 230 g of glycidyl methacrylate (LIGHT ESTER G made by KYOEISHA CHEMICAL Co., LTD., hereinafter referred to as GMA), 40 g of divinylbenzene (made by NIPPON STEEL & SUMIKIN CHEMICAL CO. LTD., hereinafter referred to as DVB), and 40 g of t-butyl-oxy-2-ethylhexanoate (Perbutyl O made by NOF CORPORATION), were mixed in advance. A total of 310 g (20 μmol/g of GMA) of this mixture was then dropped as a surface treatment (resin coating) agent into the same reactor using a peristaltic pump, and heat treatment was performed at 150° C. The steps (1) to (8) were otherwise performed in a manner similar to that of Example 2-1.

The surface-treated sol-gel silica powder thus obtained had an average particle size of 0.7 μm, a coefficient of variation of 22%, and a sphericity 0.96. No coarse particles with particle sizes of 5 μm or more were detected in laser diffraction scattering. Both the 5 μm or larger coarse particle count and the 3 μm or larger coarse particle count of the surface-treated sol-gel silica powder as measured by the Coulter counter method were less than 4 ppm. In the wet sieving process using a test sieve with 20 μm openings, the amount of residue on the sieve was less than 4 ppm. Heating loss was 4%. The surface carbon content was 0.39 mass %, and the surface polymerizable group content calculated by epoxy group (glycidyl group) quantification (according to JIS K 7236) was 5 μmol/m$^2$. The initial epoxy viscosity (η1) of the surface-treated sol-gel silica was 3.3 Pa·s, and the epoxy viscosity after a week (η2) was 3.6 Pa·s. The rate of change in viscosity with time was therefore 9%. No flow mark was observed. The α radiation of the surface-treated sol-gel silica powder was 0.002 c/(cm$^2$·h), and the impurity content was as follows. U: 0.02 ppb, Th: 0.02 ppb, Fe: 1.6 ppm, Al: 3.0 ppm, Na: 0.2 ppm, K: 0.1 ppm, Ca: 0.1 ppm, Cr: 0.1 ppm, Ni: 0.1 ppm, Ti: 0.0 ppm, and Cl$^-$: 0.4 ppm.

The physical properties of the sol-gel silica obtained by the baking step (6) of this example are shown in Table 4, and the treatment conditions for the baked silica particle surface treatment step (7) of this example are shown in Table 5. Various measurements were performed according to the above methods using the obtained surface-treated silica. The measurement results of the α radiation and the impurity content are shown in Table 6, and the measurement results of other physical properties are shown in Table 7.

Example 2-7

<Production Method (II)>

258 g (20 μmol/g) of HMDS was dropped as a surface treatment agent using a peristaltic pump to perform surface treatment as in the step (7) of Example 2-1. Three chemical solutions, specifically 460 g of glycidyl methacrylate (LIGHT ESTER G made by KYOEISHA CHEMICAL Co., LTD., hereinafter referred to as GMA), 80 g of divinylbenzene (made by NIPPON STEEL & SUMIKIN CHEMICAL CO. LTD., hereinafter referred to as DVB), and 80 g of t-butyl-oxy-2-ethylhexanoate (Perbutyl O made by NOF CORPORATION), were mixed in advance. A total of 620 g (40 μmol/g of GMA) of this mixture was then dropped as a surface treatment (resin coating) agent into the same reactor using a peristaltic pump, and heat treatment was performed at 150° C. The steps (1) to (8) were otherwise performed in a manner similar to that of Example 2-1.

The surface-treated sol-gel silica powder thus obtained had an average particle size of 0.7 μm, a coefficient of variation of 24%, and a sphericity 0.96. No coarse particles with particle sizes of 5 μm or more were detected in laser diffraction scattering. The 5 μm or larger coarse particle count and the 3 μm or larger coarse particle count of the surface-treated sol-gel silica powder as measured by the Coulter counter method were less than 4 ppm, and 8 ppm, respectively. In the wet sieving process using a test sieve with 20 μm openings, the amount of residue on the sieve was less than 4 ppm. Heating loss was 5%. The surface carbon content was 0.71 mass %, and the surface polymerizable group content calculated by epoxy group (glycidyl group) quantification (according to JIS K 7236) was 9 μmol/m$^2$. The initial epoxy viscosity (η1) of the surface-treated sol-gel silica was 3.5 Pa·s, and the epoxy viscosity after a week (η2) was 3.6 Pa·s. The rate of change in viscosity with time was therefore 3%. No flow mark was observed. The α radiation of the surface-treated sol-gel silica powder was 0.002 c/(cm$^2$·h), and the impurity content was as follows. U: 0.01 ppb, Th: 0.02 ppb, Fe: 1.5 ppm, Al: 2.9 ppm, Na: 0.2 ppm, K: 0.1 ppm, Ca: 0.1 ppm, Cr: 0.2 ppm, Ni: 0.1 ppm, Ti: 0.0 ppm, and Cl$^-$: 0.8 ppm.

The physical properties of the sol-gel silica obtained by the baking step (6) of this example are shown in Table 4, and the treatment conditions for the baked silica particle surface treatment step (7) of this example are shown in Table 5. Various measurements were performed according to the above methods using the obtained surface-treated silica. The measurement results of the α radiation and the impurity content are shown in Table 6, and the measurement results of other physical properties are shown in Table 7.

Example 2-8

<Production Method (II)>

258 g (20 µmol/g) of HMDS was dropped as a surface treatment agent using a peristaltic pump to perform surface treatment as in the step (7) of Example 2-1. Three chemical solutions, specifically 230 g of glycidyl methacrylate (made by Tokyo Chemical Industry Co., Ltd., hereinafter referred to as GMA), 100 g of a bisphenol F epoxy resin (JER806 made by Japan Epoxy Resins Co., Ltd.), and 80 g of 4,4'-methylenebis(2-methylcyclohexaneamine) (JER113 made by Japan Epoxy Resins Co., Ltd.), were mixed in advance. A total of 410 g (20 µmol/g of GMA) of this mixture was then dropped as a surface treatment (resin coating) agent into the same reactor using a peristaltic pump, and heat treatment was performed at 110° C. The steps (1) to (8) were otherwise performed in a manner similar to that of Example 2-1.

The surface-treated sol-gel silica powder thus obtained had an average particle size of 0.7 µm, a coefficient of variation of 25%, and a sphericity 0.96. No coarse particles with particle sizes of 5 µm or more were detected in laser diffraction scattering. The 5 µm or larger coarse particle count and the 3 µm or larger coarse particle count of the surface-treated sol-gel silica powder as measured by the Coulter counter method were less than 4 ppm, and 8 ppm, respectively. In the wet sieving process using a test sieve with 20 µm openings, the amount of residue on the sieve was less than 4 ppm. Heating loss was 4%. The surface carbon content was 0.59 mass %, and the surface polymerizable group content calculated by (meth)acrylic group quantification was 5 µmol/m$^2$. The initial epoxy viscosity ($\eta$1) of the surface-treated sol-gel silica was 5.3 Pa·s, and the epoxy viscosity after a week ($\eta$2) was 5.7 Pa·s. The rate of change in viscosity with time was therefore 8%. No flow mark was observed. The $\alpha$ radiation of the surface-treated sol-gel silica powder was 0.002 c/(cm$^2$·h), and the impurity content was as follows. U: 0.02 ppb, Th: 0.02 ppb, Fe: 1.5 ppm, Al: 3.1 ppm, Na: 0.2 ppm, K: 0.1 ppm, Ca: 0.1 ppm, Cr: 0.2 ppm, Ni: 0.2 ppm, Ti: 0.0 ppm, and Cl$^-$: 0.4 ppm.

The physical properties of the sol-gel silica obtained by the baking step (6) of this example are shown in Table 4, and the treatment conditions for the baked silica particle surface treatment step (7) of this example are shown in Table 5. Various measurements were performed according to the above methods using the obtained surface-treated silica. The measurement results of the $\alpha$ radiation and the impurity content are shown in Table 6, and the measurement results of other physical properties are shown in Table 7.

Example 2-9

<Production Method (II)>

475 g (20 µmol/g) of octamethylcyclotetrasiloxane (made by Tokyo Chemical Industry Co., Ltd., hereinafter referred to as D4) was dropped using a peristaltic pump, instead of the surface treatment agent used in the step (7) of Example 2-1, and heat treatment was performed at 200° C. The steps (1) to (8) were otherwise performed in a manner similar to that of Example 2-1.

The surface-treated sol-gel silica powder thus obtained had an average particle size of 0.7 µm, a coefficient of variation of 22%, and a sphericity 0.96. No coarse particles with particle sizes of 5 µm or more were detected in laser diffraction scattering. Both the 5 µm or larger coarse particle count and the 3 µm or larger coarse particle count of the surface-treated sol-gel silica powder as measured by the Coulter counter method were less than 4 ppm. In the wet sieving process using a test sieve with 20 µm openings, the amount of residue on the sieve was less than 4 ppm. Heating loss was 3%. The surface carbon content was 0.21 mass %. The initial epoxy viscosity ($\eta$1) of the surface-treated sol-gel silica was 4.7 Pa·s, and the epoxy viscosity after a week ($\eta$2) was 5.0 Pa·s. The rate of change in viscosity with time was therefore 6%. No flow mark was observed. The $\alpha$ radiation of the surface-treated sol-gel silica powder was 0.002 c/(cm$^2$·h), and the impurity content was as follows. U: 0.02 ppb, Th: 0.02 ppb, Fe: 1.5 ppm, Al: 3.0 ppm, Na: 0.2 ppm, K: 0.1 ppm, Ca: 0.1 ppm, Cr: 0.2 ppm, Ni: 0.2 ppm, Ti: 0.0 ppm, and Cl$^-$: 0.1 ppm.

Example 2-10

<Production Method (II)>

6000 g (114 µmol/g) of dimethyl silicone oil with kinematic viscosity of 5 cSt (KF-96L-5cs made by Shin-Etsu Silicones, hereinafter referred to as ScsDS) was dropped using a peristaltic pump, instead of the surface treatment agent used in the step (7) of Example 2-1, and heat treatment was performed at 250° C. The steps (1) to (8) were otherwise performed in a manner similar to that of Example 2-1.

The surface-treated sol-gel silica powder thus obtained had an average particle size of 0.7 µm, a coefficient of variation of 24%, and a sphericity 0.95. No coarse particles with particle sizes of 5 µm or more were detected in laser diffraction scattering. Both the 5 µm or larger coarse particle count and the 3 µm or larger coarse particle count of the surface-treated sol-gel silica powder as measured by the Coulter counter method were less than 4 ppm. In the wet sieving process using a test sieve with 20 µm openings, the amount of residue on the sieve was less than 4 ppm. Heating loss was 4%. The surface carbon content was 0.52 mass %. The initial epoxy viscosity ($\eta$1) of the surface-treated sol-gel silica was 4.3 Pa·s, and the epoxy viscosity after a week ($\eta$2) was 4.5 Pa·s. The rate of change in viscosity with time was therefore 5%. No flow mark was observed. The $\alpha$ radiation of the surface-treated sol-gel silica powder was 0.002 c/(cm$^2$·h), and the impurity content was as follows. U: 0.02 ppb, Th: 0.02 ppb, Fe: 1.6 ppm, Al: 3.2 ppm, Na: 0.2 ppm, K: 0.1 ppm, Ca: 0.1 ppm, Cr: 0.2 ppm, Ni: 0.2 ppm, Ti: 0.0 ppm, and Cl$^-$: 0.1 ppm.

The physical properties of the sol-gel silica obtained by the baking step (6) of this example are shown in Table 4, and the treatment conditions for the baked silica particle surface treatment step (7) of this example are shown in Table 5. Various measurements were performed according to the above methods using the obtained surface-treated silica. The measurement results of the $\alpha$ radiation and the impurity content are shown in Table 6, and the measurement results of other physical properties are shown in Table 7.

Example 2-11

<Production Method (II)>

A rocking mixer with a capacity of 150 L (RM-150 made by AICHI ELECTRIC Co., Ltd.) was used instead of the mixer for surface treatment used in the step (7) of Example 2-1. Unlike in the step (7) of Example 2-1, 40 kg of sol-gel silica powder was placed into the mixer, and 129 g (20 µmol/g) of HMDS was dropped. The steps (1) to (8) were otherwise performed in a manner similar to that of Example 2-1.

The surface-treated sol-gel silica powder thus obtained had an average particle size of 0.7 µm, a coefficient of variation of 24%, and a sphericity 0.97. No coarse particles with particle sizes of 5 μm or more were detected in laser diffraction scattering. Both the 5 μm or larger coarse particle count and the 3 μm or larger coarse particle count of the surface-treated sol-gel silica powder as measured by the Coulter counter method were less than 4 ppm. In the wet sieving process using a test sieve with 20 μm openings, the amount of residue on the sieve was less than 4 ppm. Heating loss was 4%. The surface carbon content was 0.07 mass %. The initial epoxy viscosity (η1) of the surface-treated sol-gel silica was 3.4 Pa·s, and the epoxy viscosity after a week (η2) was 3.5 Pa·s. The rate of change in viscosity with time was therefore 3%. No flow mark was observed. The α radiation of the surface-treated sol-gel silica powder was 0.002 c/(cm²·h), and the impurity content was as follows. U: 0.02 ppb, Th: 0.02 ppb, Fe: 1.5 ppm, Al: 3.0 ppm, Na: 0.2 ppm, K: 0.1 ppm, Ca: 0.1 ppm, Cr: 0.2 ppm, Ni: 0.2 ppm, Ti: 0.0 ppm, and Cl⁻: 0.1 ppm.

The physical properties of the sol-gel silica obtained by the baking step (6) of this example are shown in Table 4, and the treatment conditions for the baked silica particle surface treatment step (7) of this example are shown in Table 5. Various measurements were performed according to the above methods using the obtained surface-treated silica. The measurement results of the α radiation and the impurity content are shown in Table 6, and the measurement results of other physical properties are shown in Table 7.

Example 2-12

<Production Method (II)>

Unlike in the step (1) of Example 2-1, 90 kg of tetramethoxysilane, 25 kg of methanol, and 40 kg (25 mass %) of aqueous ammonia were added as a raw material after production of silica seed particles.

The baked sol-gel silica powder obtained by the step (6) had an average particle size of 0.4 μm, and no coarse particles with particle sizes of 5 μm or more were detected in laser diffraction scattering. Both the 5 μm or larger coarse particle count and the 3 μm or larger coarse particle count of the surface-treated sol-gel silica powder as measured by the Coulter counter method were less than 4 ppm. The specific surface area was 7 m²/g, and the surface silanol group content was 5 μmol/m² (three silanol groups/nm²).

Unlike in the step (7) of Example 2-1, 450 g (35 μmol/g) of HMDS was dropped. The step (7) was otherwise performed in a manner similar to that of the step (7) in Example 2-1.

The surface-treated sol-gel silica powder thus obtained had an average particle size of 0.4 μm, a coefficient of variation of 16%, and a sphericity 0.98. No coarse particles with particle sizes of 5 μm or more were detected in laser diffraction scattering. Both the 5 μm or larger coarse particle count and the 3 μm or larger coarse particle count of the surface-treated sol-gel silica powder as measured by the Coulter counter method were less than 4 ppm. In the wet sieving process using a test sieve with 20 μm openings, the amount of residue on the sieve was less than 4 ppm. Heating loss was 3%. The surface carbon content was 0.12 mass %. The initial epoxy viscosity (η1) of the surface-treated sol-gel silica was 7.3 Pa·s, and the epoxy viscosity after a week (η2) was 7.7 Pa·s. The rate of change in viscosity with time was therefore 5%. No flow mark was observed. The α radiation of the surface-treated sol-gel silica powder was 0.002 c/(cm²·h), and the impurity content was as follows. U: 0.01 ppb, Th: 0.02 ppb, Fe: 0.8 ppm, Al: 2.2 ppm, Na: 0.2 ppm, K: 0.1 ppm, Ca: 0.1 ppm, Cr: 0.2 ppm, Ni: 0.1 ppm, Ti: 0.0 ppm, and Cl⁻: 0.1 ppm.

The physical properties of the sol-gel silica obtained by the baking step (6) of this example are shown in Table 4, and the treatment conditions for the baked silica particle surface treatment step (7) of this example are shown in Table 5. Various measurements were performed according to the above methods using the obtained surface-treated silica. The measurement results of the α radiation and the impurity content are shown in Table 6, and the measurement results of other physical properties are shown in Table 7.

Example 2-13

<Production Method (II)>

A reactor having a capacity of 4000 L was used in the step (1) instead of the reactor used in the step (1) of Example 2-1. Unlike in the step (1) of Example 2-1, 1750 kg of tetramethoxysilane, 500 kg of methanol, and 750 kg (25 mass %) of aqueous ammonia were added as a raw material after production of silica seed particles.

The baked sol-gel silica powder obtained by the step (6) had an average particle size of 1.1 μm, and no coarse particles with particle sizes of 5 μm or more were detected in laser diffraction scattering. The 5 μm or larger coarse particle count and the 3 μm or larger coarse particle count of the surface-treated sol-gel silica powder as measured by the Coulter counter method were 8 ppm and 15 ppm, respectively. The specific surface area was 3 m²/g, and the surface silanol group content was 5 μmol/m² (three silanol groups/nm²).

The steps (1) to (8) were otherwise performed in a manner similar to that of Example 2-1.

The surface-treated sol-gel silica powder thus obtained had an average particle size of 1.1 μm, a coefficient of variation of 28%, and a sphericity 0.95. No coarse particles with particle sizes of 5 μm or more were detected in laser diffraction scattering. The 5 μm or larger coarse particle count and the 3 μm or larger coarse particle count of the surface-treated sol-gel silica powder as measured by the Coulter counter method were 8 ppm and 12 ppm, respectively. In the wet sieving process using a test sieve with 20 μm openings, the amount of residue on the sieve was less than 4 ppm. Heating loss was 2%. The surface carbon content was 0.05 mass %. The initial epoxy viscosity (η1) of the surface-treated sol-gel silica was 2.8 Pa·s, and the epoxy viscosity after a week (η2) was 2.8 Pa·s. The rate of change in viscosity with time was therefore 0%. No flow mark was observed. The α radiation of the surface-treated sol-gel silica powder was 0.002 c/(cm²·h), and the impurity content was as follows. U: 0.02 ppb, Th: 0.02 ppb, Fe: 1.6 ppm, Al: 6.2 ppm, Na: 0.2 ppm, K: 0.1 ppm, Ca: 0.1 ppm, Cr: 0.4 ppm, Ni: 0.3 ppm, Ti: 0.0 ppm, and Cl⁻: 0.1 ppm.

The physical properties of the sol-gel silica obtained by the baking step (6) of this example are shown in Table 4, and the treatment conditions for the baked silica particle surface treatment step (7) of this example are shown in Table 5. Various measurements were performed according to the above methods using the obtained surface-treated silica. The measurement results of the α radiation and the impurity content are shown in Table 6, and the measurement results of other physical properties are shown in Table 7.

Example 2-14

<Production Method (II)>

A reactor having a capacity of 10000 L was used in the step (1) instead of the reactor used in the step (1) of Example 2-1. Unlike in the step (1) of Example 2-1, 4200 kg of tetramethoxysilane, 1200 kg of methanol, and 1800 kg (25 mass %) of aqueous ammonia were added as a raw material after production of silica seed particles.

The baked sol-gel silica powder obtained by the step (6) had an average particle size of 1.5 μm, and no coarse particles with particle sizes of 5 μm or more were detected in laser diffraction scattering. The 5 μm or larger coarse particle count and the 3 μm or larger coarse particle count of the surface-treated sol-gel silica powder as measured by the Coulter counter method were 10 ppm and 20 ppm, respectively. In the wet sieving process using a test sieve with 20 μm openings, the amount of residue on the sieve was less than 4 ppm. The specific surface area was 2 m$^2$/g, and the surface silanol group content was 5 μmol/m$^2$ (three silanol groups/nm$^2$). The steps (1) to (8) were otherwise performed in a manner similar to that of Example 2-1.

The surface-treated sol-gel silica powder thus obtained had an average particle size of 1.5 μm, a coefficient of variation of 29%, and a sphericity 0.95. No coarse particles with particle sizes of 5 μm or more were detected in laser diffraction scattering. The 5 μm or larger coarse particle count and the 3 μm or larger coarse particle count of the surface-treated sol-gel silica powder as measured by the Coulter counter method were 8 ppm and 15 ppm, respectively. In the wet sieving process using a test sieve with 20 μm openings, the amount of residue on the sieve was less than 4 ppm. Heating loss was 2%. The surface carbon content was 0.03 mass %. The initial epoxy viscosity (η1) of the surface-treated sol-gel silica was 2.1 Pa·s, and the epoxy viscosity after a week (η2) was 2.1 Pa·s. The rate of change in viscosity with time was therefore 0%. No flow mark was observed. The α radiation of the surface-treated sol-gel silica powder was 0.002 c/(cm$^2$·h), and the impurity content was as follows. U: 0.02 ppb, Th: 0.02 ppb, Fe: 1.7 ppm, Al: 6.4 ppm, Na: 0.2 ppm, K: 0.1 ppm, Ca: 0.1 ppm, Cr: 0.4 ppm, Ni: 0.3 ppm, Ti: 0.0 ppm, and Cl$^-$: 0.1 ppm.

The physical properties of the sol-gel silica obtained by the baking step (6) of this example are shown in Table 4, and the treatment conditions for the baked silica particle surface treatment step (7) of this example are shown in Table 5. Various measurements were performed according to the above methods using the obtained surface-treated silica. The measurement results of the α radiation and the impurity content are shown in Table 6, and the measurement results of other physical properties are shown in Table 7.

Example 2-15

<Production Method (II)>

A polypropylene filter with a pore size of 5 μm was used in the step (8) instead of the filter used in the step (8) of Example 2-1. The steps (1) to (8) were otherwise performed in a manner similar to that of Example 2-1.

The surface-treated sol-gel silica powder thus obtained had an average particle size of 0.7 μm, a coefficient of variation of 26%, and a sphericity 0.96. No coarse particles with particle sizes of 5 μm or more were detected in laser diffraction scattering. The 5 μm or larger coarse particle count and the 3 μm or larger coarse particle count of the surface-treated sol-gel silica powder as measured by the Coulter counter method were 9 ppm and 120 ppm, respectively. In the wet sieving process using a test sieve with 20 μm openings, the amount of residue on the sieve was less than 4 ppm. Heating loss was 2%. The surface carbon content was 0.07 mass %. The initial epoxy viscosity (η1) of the surface-treated sol-gel silica was 3.3 Pa·s, and the epoxy viscosity after a week (η2) was 3.5 Pa·s. The rate of change in viscosity with time was therefore 6%. No flow mark was observed. The α radiation of the surface-treated sol-gel silica powder was 0.002 c/(cm$^2$·h), and the impurity content was as follows. U: 0.02 ppb, Th: 0.02 ppb, Fe: 1.4 ppm, Al: 2.9 ppm, Na: 0.2 ppm, K: 0.1 ppm, Ca: 0.1 ppm, Cr: 0.1 ppm, Ni: 0.2 ppm, Ti: 0.0 ppm, and Cl$^-$: 0.1 ppm.

The physical properties of the sol-gel silica obtained by the baking step (6) of this example are shown in Table 4, and the treatment conditions for the baked silica particle surface treatment step (7) of this example are shown in Table 5. Various measurements were performed according to the above methods using the obtained surface-treated silica. The measurement results of the α radiation and the impurity content are shown in Table 6, and the measurement results of other physical properties are shown in Table 7.

Comparative Example 2-1

The wet filtering of the surface-treated sol-gel silica powder in the step (8) of Example 2-1 was not performed. The steps (1) to (8) were otherwise performed in a manner similar to that of Example 2-1.

The surface-treated sol-gel silica powder thus obtained had an average particle size of 0.7 μm, a coefficient of variation of 27%, and a sphericity 0.96. No coarse particles with particle sizes of 5 μm or more were detected in laser diffraction scattering. The 5 μm or larger coarse particle count and the 3 μm or larger coarse particle count of the surface-treated sol-gel silica powder as measured by the Coulter counter method were 240 ppm and 28000 ppm, respectively. In the wet sieving process using a test sieve with 20 μm openings, the amount of residue on the sieve was 10 ppm. Heating loss was 2%. The surface carbon content was 0.07 mass %. The initial epoxy viscosity (η1) of the surface-treated sol-gel silica was 3.4 Pa·s, and the epoxy viscosity after a week (η2) was 3.8 Pa·s. The rate of change in viscosity with time was therefore 12%. No flow mark was observed. The α radiation of the surface-treated sol-gel silica powder was 0.002 c/(cm$^2$·h), and the impurity content was as follows. U: 0.02 ppb, Th: 0.02 ppb, Fe: 1.5 ppm, Al: 3.0 ppm, Na: 0.2 ppm, K: 0.1 ppm, Ca: 0.1 ppm, Cr: 0.2 ppm, Ni: 0.2 ppm, Ti: 0.0 ppm, and Cl$^-$: 0.1 ppm.

The physical properties of the sol-gel silica obtained by the baking step (6) of this example are shown in Table 4, and the treatment conditions for the baked silica particle surface treatment step (7) of this example are shown in Table 5. Various measurements were performed according to the above methods using the obtained surface-treated silica. The measurement results of the c radiation and the impurity content are shown in Table 6, and the measurement results of other physical properties are shown in Table 7.

Comparative Example 2-2

<Production Method (II)>

Wet filtration was performed after the crushing of the sol-gel silica powder in the step (6) of Example 2-1. The wet filtering of the surface-treated sol-gel silica powder was not performed in the step (8). The steps (1) to (8) were otherwise performed in a manner similar to that of Example 2-1.

The surface-treated sol-gel silica powder thus obtained had an average particle size of 0.7 μm, a coefficient of variation of 27%, and a sphericity 0.96. No coarse particles with particle sizes of 5 μm or more were detected in laser diffraction scattering. The 5 μm or larger coarse particle count and the 3 μm or larger coarse particle count of the surface-treated sol-gel silica powder as measured by the Coulter counter method were 80 ppm and 6600 ppm, respectively. In the wet sieving process using a test sieve with 20 μm openings, the amount of residue on the sieve was less than 4 ppm. Heating loss was 3%. The surface carbon content was 0.07 mass %. The initial epoxy viscosity (η1) of the surface-treated sol-gel silica was 3.3 Pa·s, and the epoxy viscosity after a week (η2) was 3.7 Pa·s. The rate of change in viscosity with time was therefore 12%. No flow mark was observed. The α radiation of the surface-treated sol-gel silica powder was 0.002 c/(cm²·h), and the impurity content was as follows. U: 0.02 ppb, Th: 0.02 ppb, Fe: 1.4 ppm, Al: 2.9 ppm, Na: 0.2 ppm, K: 0.1 ppm, Ca: 0.1 ppm, Cr: 0.1 ppm, Ni: 0.2 ppm, Ti: 0.0 ppm, and Cl⁻: 0.1 ppm.

The physical properties of the sol-gel silica obtained by the baking step (6) of this example are shown in Table 4, and the treatment conditions for the baked silica particle surface treatment step (7) of this example are shown in Table 5. Various measurements were performed according to the above methods using the obtained surface-treated silica. The measurement results of the α radiation and the impurity content are shown in Table 6, and the measurement results of other physical properties are shown in Table 7.

TABLE 4

| | Physical Properties of Baked Sol-Gel Silica (Before Surface Treatment) | | | | | |
|---|---|---|---|---|---|---|
| | Average Particle Size (μm) | 5 μm or larger Laser Diffraction Scattering (—) | Coarse Particle Count by Coulter Counter Method (ppm) ≥5 μm | ≥3 μm | Specific Surface Area (m²/g) | Surface Silanol Group Content per Unit Surface Area (μmol/m²) | Surface Silanol Group Count per Unit Surface Area (silanol groups/(nm²) |
| Example 2-1 | 0.7 | None detected | 5 | 8 | 4 | 5 | 3 |
| Example 2-2 | 0.7 | None detected | 5 | 8 | 4 | 5 | 3 |
| Example 2-3 | 0.7 | None detected | 5 | 8 | 4 | 5 | 3 |
| Example 2-4 | 0.7 | None detected | 5 | 8 | 4 | 5 | 3 |
| Example 2-5 | 0.7 | None detected | 5 | 8 | 4 | 5 | 3 |
| Example 2-6 | 0.7 | None detected | 5 | 8 | 4 | 5 | 3 |
| Example 2-7 | 0.7 | None detected | 5 | 8 | 4 | 5 | 3 |
| Example 2-8 | 0.7 | None detected | 5 | 8 | 4 | 5 | 3 |
| Example 2-9 | 0.7 | None detected | 5 | 8 | 4 | 5 | 3 |
| Example 2-10 | 0.7 | None detected | 5 | 8 | 4 | 5 | 3 |
| Example 2-11 | 0.7 | None detected | 5 | 8 | 4 | 5 | 3 |
| Example 2-12 | 0.4 | None detected | <4 | <4 | 7 | 5 | 3 |
| Example 2-13 | 1.1 | None detected | 8 | 15 | 3 | 5 | 3 |
| Example 2-14 | 1.5 | None detected | 10 | 20 | 2 | 5 | 3 |
| Example 2-15 | 0.7 | None detected | 25 | 240 | 4 | 5 | 3 |
| Comparative Example 2-1 | 0.7 | None detected | 5 | 8 | 4 | 5 | 3 |
| Comparative Example 2-2 | 0.7 | None detected | 5 | 8 | 4 | 5 | 3 |

TABLE 5

Treatment Conditions for Baked Silica Particle Surface Treatment Step (7)

| | Average Particle Size (μm) | Type of Mixer for Surface Treatment | Capacity of Mixer for Surface Treatment (L) | Mass of Silica Placed in Mixer for Surface Treatment (kg) | Type of Surface Treatment Agent | Molecular Weight of Surface Treatment Agent | Amount of Surface Treatment Agent (g) | Amount of Surface Treatment Agent per Unit Mass (μ mol/g) | Amount of Surface Treatment Agent per Unit Area (μ mol/m$^2$) | Heat Treatment Temperature (° C) |
|---|---|---|---|---|---|---|---|---|---|---|
| Example 2-1 | 0.7 | Double-cone | 340 | 80 | HMDS | 161.4 | 258 | 20 | 5 | 150 |
| Example 2-2 | 0.7 | Double-cone | 340 | 80 | AcPS | 234.3 | 375 | 20 | 5 | 150 |
| Example 2-3 | 0.7 | Double-cone | 340 | 80 | AcPS | 234.3 | 750 | 40 | 10 | 150 |
| Example 2-4 | 0.7 | Double-cone | 340 | 80 | γ-GPS | 236.3 | 378 | 20 | 5 | 150 |
| Example 2-5 | 0.7 | Double-cone | 340 | 80 | γ-GPS | 236.3 | 756 | 40 | 10 | 150 |
| Example 2-6 | 0.7 | Double-cone | 340 | 80 | Epoxy group resin monitor (GMA) etc. | 142.2 | 310 | 20 | 5 | 150 |
| Example 2-7 | 0.7 | Double-cone | 340 | 80 | Epoxy group resin monitor (GMA) etc. | 142.2 | 620 | 40 | 10 | 150 |
| Example 2-8 | 0.7 | Double-cone | 340 | 80 | Methacrylic group resin monitor (GMA) etc. | 142.2 | 410 | 20 | 5 | 110 |
| Example 2-9 | 0.7 | Double-cone | 340 | 80 | D4 | 296.6 | 475 | 20 | 5 | 200 |
| Example 2-10 | 0.7 | Double-cone | 340 | 80 | 5csDS | 660 | 6000 | 114 | 29 | 250 |
| Example 2-11 | 0.7 | Rocking Mixer | 150 | 40 | HMDS | 161.4 | 129 | 20 | 5 | 150 |
| Example 2-12 | 0.4 | Double-cone | 340 | 80 | HMDS | 161.4 | 450 | 35 | 5 | 150 |
| Example 2-13 | 1.1 | Double-cone | 340 | 80 | HMDS | 161.4 | 258 | 20 | 7 | 150 |
| Example 2-14 | 1.5 | Double-cone | 340 | 80 | HMDS | 161.4 | 258 | 20 | 10 | 150 |
| Example 2-15 | 0.7 | Double-cone | 340 | 80 | HMDS | 161.4 | 258 | 20 | 5 | 150 |
| Comparative Example 2-1 | 0.7 | Double-cone | 340 | 80 | HMDS | 161.4 | 258 | 20 | 5 | 150 |
| Comparative Example 2-2 | 0.7 | Double-cone | 340 | 80 | HMDS | 161.4 | 258 | 20 | 5 | 150 |

TABLE 6

Treatment Conditions of Baked Silica Particle Surface Treatment Step (7)

| | α Radiation (c/cm$^2$ · h) | U (ppb) | Th (ppb) | Fe (ppm) | Al (ppm) | Na (ppm) | K (ppm) | Ca (ppm) | Cr (ppm) | Ni (ppm) | Ti (ppm) | Cl$^-$ (ppm) |
|---|---|---|---|---|---|---|---|---|---|---|---|---|
| Example 2-1 | 0.002 | 0.02 | 0.02 | 1.5 | 3.0 | 0.2 | 0.1 | 0.1 | 0.2 | 0.2 | 0.0 | 0.1 |
| Example 2-2 | 0.002 | 0.02 | 0.02 | 1.5 | 3.0 | 0.2 | 0.1 | 0.1 | 0.1 | 0.2 | 0.0 | 0.1 |
| Example 2-3 | 0.002 | 0.02 | 0.01 | 1.4 | 2.8 | 0.2 | 0.1 | 0.1 | 0.2 | 0.1 | 0.0 | 0.1 |
| Example 2-4 | 0.002 | 0.01 | 0.02 | 1.5 | 3.0 | 0.2 | 0.1 | 0.1 | 0.2 | 0.2 | 0.0 | 0.1 |
| Example 2-5 | 0.002 | 0.02 | 0.01 | 1.6 | 3.0 | 0.2 | 0.1 | 0.1 | 0.2 | 0.2 | 0.0 | 0.1 |
| Example 2-6 | 0.002 | 0.02 | 0.02 | 1.6 | 3.0 | 0.2 | 0.1 | 0.1 | 0.1 | 0.1 | 0.0 | 0.4 |
| Example 2-7 | 0.002 | 0.01 | 0.02 | 1.5 | 2.9 | 0.2 | 0.1 | 0.1 | 0.2 | 0.1 | 0.0 | 0.8 |
| Example 2-8 | 0.002 | 0.02 | 0.02 | 1.5 | 3.1 | 0.2 | 0.1 | 0.1 | 0.2 | 0.2 | 0.0 | 0.4 |
| Example 2-9 | 0.002 | 0.02 | 0.02 | 1.5 | 3.0 | 0.2 | 0.1 | 0.1 | 0.2 | 0.2 | 0.0 | 0.1 |
| Example 2-10 | 0.002 | 0.02 | 0.02 | 1.6 | 3.2 | 0.2 | 0.1 | 0.1 | 0.2 | 0.2 | 0.0 | 0.1 |
| Example 2-11 | 0.002 | 0.02 | 0.02 | 1.5 | 3.0 | 0.2 | 0.1 | 0.1 | 0.2 | 0.2 | 0.0 | 0.1 |
| Example 2-12 | 0.002 | 0.01 | 0.02 | 0.8 | 2.2 | 0.2 | 0.1 | 0.1 | 0.2 | 0.1 | 0.0 | 0.1 |
| Example 2-13 | 0.002 | 0.02 | 0.02 | 1.6 | 6.2 | 0.2 | 0.1 | 0.1 | 0.4 | 0.3 | 0.0 | 0.1 |
| Example 2-14 | 0.002 | 0.02 | 0.02 | 1.7 | 6.4 | 0.2 | 0.1 | 0.1 | 0.4 | 0.3 | 0.1 | 0.1 |
| Example 2-15 | 0.002 | 0.02 | 0.02 | 1.4 | 2.9 | 0.2 | 0.1 | 0.1 | 0.1 | 0.2 | 0.0 | 0.1 |
| Comparative Example 2-1 | 0.002 | 0.02 | 0.02 | 1.5 | 3.0 | 0.2 | 0.1 | 0.1 | 0.2 | 0.2 | 0.0 | 0.1 |
| Comparative Example 2-2 | 0.002 | 0.02 | 0.02 | 1.4 | 2.9 | 0.2 | 0.1 | 0.1 | 0.1 | 0.2 | 0.0 | 0.1 |

TABLE 7

| | Physical Properties of Surface-Treated Sol-Gel Silica | | | | | | | |
|---|---|---|---|---|---|---|---|---|
| | Average Particle Size (μm) | Coefficient of Variation (%) | Sphericity (—) | Laser Diffraction Scattering (vol %) ≥5 μm | ≥5 μm | Coarse Particle Count by Coulter ≥3 μm | Residue on 20 μm Test Sieve (ppm) | Heating Loss (%) |
| Example 2-1 | 0.7 | 24 | 0.96 | None detected | <4 | 8 | <4 | 2 |
| Example 2-2 | 0.7 | 22 | 0.96 | None detected | <4 | 8 | <4 | 3 |
| Example 2-3 | 0.7 | 24 | 0.96 | None detected | <4 | 8 | <4 | 4 |
| Example 2-4 | 0.7 | 22 | 0.97 | None detected | <4 | <4 | <4 | 3 |
| Example 2-5 | 0.7 | 24 | 0.96 | None detected | <4 | 8 | <4 | 3 |
| Example 2-6 | 0.7 | 22 | 0.96 | None detected | <4 | <4 | <4 | 4 |
| Example 2-7 | 0.7 | 24 | 0.96 | None detected | <4 | 8 | <4 | 5 |
| Example 2-8 | 0.7 | 25 | 0.96 | None detected | <4 | 8 | <4 | 4 |
| Example 2-9 | 0.7 | 22 | 0.96 | None detected | <4 | <4 | <4 | 3 |
| Example 2-10 | 0.7 | 24 | 0.95 | None detected | <4 | <4 | <4 | 4 |
| Example 2-11 | 0.7 | 24 | 0.97 | None detected | <4 | <4 | <4 | 2 |
| Example 2-12 | 0.4 | 16 | 0.98 | None detected | <4 | <4 | <4 | 3 |
| Example 2-13 | 1.1 | 28 | 0.95 | None detected | 8 | 12 | <4 | 2 |
| Example 2-14 | 1.5 | 29 | 0.95 | None detected | 8 | 15 | <4 | 2 |
| Example 2-15 | 0.7 | 26 | 0.96 | None detected | 9 | 120 | <4 | 2 |
| Comparative Example 2-1 | 0.7 | 27 | 0.96 | None detected | 240 | 28000 | 10 | 2 |
| Comparative Example 2-2 | 0.7 | 27 | 0.96 | None detected | 80 | 6600 | <4 | 3 |

| | Physical Properties of Surface-Treated Sol-Gel Silica | | | | | | |
|---|---|---|---|---|---|---|---|
| | Surface Carbon Content (mass %) | Surface Carbon Content (μmol/g) | Surface Polymerizable Group Content Calculated from Surface Polymerizable Group Content (μmol/²) | Epoxy Viscosity (Pa·s) Initial (η1) | After a week (η2) | Rate of Change in Viscosity with Time (%) | Flow Marks (—) |
| Example 2-1 | 0.07 | — | — | 3.2 | 3.3 | 3 | None |
| Example 2-2 | 0.14 | 19 | 5 | 3.8 | 4.2 | 11 | None |
| Example 2-3 | 0.28 | 39 | 10 | 3.9 | 4.0 | 3 | None |
| Example 2-4 | 0.13 | 18 | 5 | 4.3 | 4.6 | 7 | None |
| Example 2-5 | 0.27 | 38 | 9 | 4.5 | 4.6 | 2 | None |
| Example 2-6 | 0.39 | — | 5 | 3.3 | 3.6 | 9 | None |
| Example 2-7 | 0.71 | — | 9 | 3.5 | 3.6 | 3 | None |
| Example 2-8 | 0.59 | — | 5 | 5.3 | 5.7 | 8 | None |
| Example 2-9 | 0.21 | — | — | 4.7 | 5.0 | 6 | None |
| Example 2-10 | 0.52 | — | — | 4.3 | 4.5 | 5 | None |
| Example 2-11 | 0.07 | — | — | 3.4 | 3.5 | 3 | None |
| Example 2-12 | 0.12 | — | — | 7.3 | 7.7 | 5 | None |
| Example 2-13 | 0.05 | — | — | 2.8 | 2.8 | 0 | Almost None |
| Example 2-14 | 0.03 | — | — | 2.1 | 2.1 | 0 | Almost None |
| Example 2-15 | 0.07 | — | — | 3.3 | 3.5 | 6 | Almost None |
| Comparative Example 2-1 | 0.07 | — | — | 3.4 | 3.8 | 12 | Yes |
| Comparative Example 2-2 | 0.07 | — | — | 3.3 | 3.7 | 12 | Yes |

The invention claimed is:

1. Surface-treated sol-gel silica, characterized in that
   sol-gel silica particles have their surfaces modified by a surface treatment agent,
   the sol-gel silica particles have an average particle size of 0.05 μm or more and 2.0 μm or less as measured by laser diffraction scattering, and
   a content of particles with a particle size of 5 μm or more is 10 ppm or less in a particle number size distribution obtained by a Coulter counter method, wherein
   and
   the surface treatment agent is a crosslinked polymer having an epoxy group or a (meth) acrylic group.

2. The surface-treated sol-gel silica of claim 1, characterized in that
   the content of particles with the particle size of 3 μm or more is 10 ppm or less in the particle number size distribution obtained by the Coulter counter method.

3. The surface-treated sol-gel silica of claim 1, characterized in that
   surface carbon content is 0.01 mass % or more and 1 mass % or less.

4. The surface-treated sol-gel silica claim 1, characterized in that
   α radiation is 0.002 c/cm$^2$·h or less.

5. The surface-treated sol-gel silica of claim 1, characterized in that
   U content is 0.1 ppb or less and Th content is 0.1 ppb or less.

6. The surface-treated sol-gel silica of claim 1, characterized in that
   Fe content is 10 ppm or less, Al content is 10 ppm or less, Na content is 5 ppm or less, K content is 5 ppm or less, and chloride ion content is 1 ppm or less.

7. The surface-treated sol-gel silica of claim 1, characterized in that
   Ca content is 5 ppm or less, Cr content is 5 ppm or less, Ni content is 5 ppm or less, and Ti content is 5 ppm or less.

* * * * *